United States Patent
Watanabe et al.

(10) Patent No.: US 11,232,962 B2
(45) Date of Patent: Jan. 25, 2022

(54) ALIGNMENT DEVICE, SEMICONDUCTOR WAFER PROCESSING DEVICE, AND ALIGNMENT METHOD

(71) Applicant: HIRATA CORPORATION, Kumamoto (JP)

(72) Inventors: Hiroki Watanabe, Kumamoto (JP); Tetsuya Sakai, Kumamoto (JP); Hiroshi Kikai, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 560 days.

(21) Appl. No.: 16/236,766

(22) Filed: Dec. 31, 2018

(65) Prior Publication Data

US 2020/0006103 A1 Jan. 2, 2020

(30) Foreign Application Priority Data

Jun. 28, 2018 (JP) .............................. JP2018-122933

(51) Int. Cl.
*H01L 21/67* (2006.01)
*H01L 21/68* (2006.01)
*H01L 21/687* (2006.01)

(52) U.S. Cl.
CPC .. *H01L 21/67271* (2013.01); *H01L 21/67259* (2013.01); *H01L 21/67294* (2013.01); *H01L 21/681* (2013.01); *H01L 21/68735* (2013.01); *H01L 21/68764* (2013.01); *H01L 21/68707* (2013.01)

(58) Field of Classification Search
None
See application file for complete search history.

(56) References Cited

U.S. PATENT DOCUMENTS

2010/0171823 A1    7/2010   Yamamoto et al.

FOREIGN PATENT DOCUMENTS

| CN | 103811387 A | 5/2014 |
|---|---|---|
| GB | 2250264 A | 6/1992 |
| JP | 2586261 Y2 | 12/1998 |
| JP | 4720790 B2 | 7/2011 |
| JP | 5379589 B2 | 12/2013 |
| JP | 5452166 B2 | 3/2014 |
| TW | 201034113 A1 | 9/2010 |

OTHER PUBLICATIONS

Oct. 2, 2019, Taiwanese Office Action issued for related TW Application No. 108105367.

*Primary Examiner* — Ronald P Jarrett
(74) *Attorney, Agent, or Firm* — Paratus Law Group, PLLC

(57) ABSTRACT

An alignment device which aligns notch portions of wafers includes mounting tables that hold the wafers, movement units that move the mounting tables, notch portion detection units that detect a circumferential positions of the notch portion, and a controller that controls positions of the mounting tables by the movement units. The mounting tables includes a mounting table main body portion and a pad member attached to an opening in the mounting table main body portion to hold the wafers. The pad member includes the main body portion that is attached to the opening and has a through hole in a center portion thereof, the first annular portion on an end side of the pad member to abut against wafers, and the first collar portion that is integrally provided with the first annular portion and the main body portion and extends toward outside of the main body portion.

12 Claims, 13 Drawing Sheets

ALIGNMENT DEVICE, SEMICONDUCTOR WAFER PROCESSING DEVICE, AND ALIGNMENT METHOD

CROSS-REFERENCE TO RELATED APPLICATION

This application is based upon and claims the benefit of priority from Japanese Patent Application No. 2018-122933, filed on Jun. 28, 2018, the entire contents of which are incorporated herein by reference.

TECHNICAL FIELD

The present invention relates to an alignment device which positions a wafer. The present invention also relates to a semiconductor wafer processing device including the alignment device, and an alignment method using the alignment device.

BACKGROUND ART

Generally, a series of processing steps are performed in a manufacturing process of a semiconductor device, such as a patterning step of applying a photoresist to a semiconductor wafer (hereinafter, referred to as wafer) serving as a substrate to be processed and baking a pattern of a circuit, a film forming step of forming various films, and an etching step of removing unnecessary parts or films on the wafer.

When predetermined processing is performed on the wafer, the predetermined processing is preferably performed in a state in which a crystal orientation of the wafer is held in a predetermined direction, which is apparent in the patterning step as well as other steps. For this reason, an alignment device is generally used, in which a notch cut in a U shape or a V shape is provided at an edge of a wafer, a circumferential position of the notch of the wafer to be processed is detected by a notch detection sensor, and the notch is positioned (i.e., aligned) to be aligned with a predetermined circumferential position based on the detected data. In this way, a plurality of wafers, which are in a state in which orientations of these wafers are held in a predetermined direction, are transferred by a robot to a next processing step.

Such an alignment device may be used by being installed on a special device called a sorter. The sorter (sorting device) includes, for example, two load ports, one or two wafer transferring robots, and one or two alignment devices. Each of the load ports includes a lid opening and closing mechanism that, in a state in which inflow of outside air is blocked, opens and closes a lid of a container (for example, an FOUP) storing a plurality of wafers. Here, one of the load ports includes an FOUP that stores a plurality of wafers having random orientations. The other load port includes an empty FOUP. A robot extracts one (or two) of the plurality of wafers having random orientations from the FOUP of the one load port, and transfers the extracted wafer to the alignment device. The alignment device aligns an orientation of the wafer in a predetermined direction, and then the robot brings the wafer from the alignment device and transfers the wafer to the FOUP of the other load port on standby. By repeating this operation, wafers in the FOUP at the one load port are transferred into the FOUP at the other load port in a state in which orientations of these wafers are aligned in the predetermined direction.

Currently, a sorter may include two alignment devices. However, in this case, a footprint of the sorter is increased by simply adding one alignment device and by arranging two alignment devices side by side, which reduces throughput of the sorter.

Further, in the alignment devices, an ID embedded on a wafer may be read in addition to aligning an orientation of the wafer accurately.

Instead of mounting two alignment devices in a sorter, it is conceivable to mount one alignment device capable of aligning two wafers (hereinafter, referred to as W wafer alignment device).

The alignment device includes, on one main body thereof, two mounting tables, two notch detection units, and two ID reading units. This makes the alignment device generally complicated and costs thereof are increased.

JP-B-5452166 discloses an alignment device that is an example of the W wafer alignment device. In the alignment device described in JP-B-5452166, a robot transfers two wafers to the alignment device at the same time in a state in which the two wafers are stacked in a vertical direction, and the two wafers are aligned in the alignment device at the same time and brought therefrom by the robot at the same time, so that alignment time is short.

SUMMARY OF INVENTION

Problems to be Solved by Invention

However, in the alignment device described in JP-B-5452166, the two wafers are aligned side by side in a horizontal direction. Therefore, holding postures of the two wafers need changing after the robot transfers the two wafers to the alignment device and before the robot brings the two wafers from the alignment device. As a result, throughput of the alignment device is lowered.

Further, the alignment device described in JP-B-5452166 needs to adjust a position of an arm on the robot side when the robot brings the wafers from the alignment device. That is, the robot brings the wafers by adjusting the arm thereof finely for each wafer based on information on a wafer center detected by the alignment device, so that a center of a wafer mounting portion (hand) of the arm of the robot coincides with the wafer center on the alignment device. Therefore, there may be a problem that time of the fine adjustment is loss and the throughput of the alignment device is reduced.

Further, the alignment device described in JP-B-5452166 does not clearly describe a unit for reading an ID embedded on the wafers. If an ID reading unit is simply equipped as one for one wafer, a size of the entire alignment device is increased, and costs of the alignment device is increased since an ID reading device is expensive.

JP-B-4720790 discloses an alignment device that is another example of the W wafer alignment device. The alignment device described in JP-B-4720790 is the same as the alignment device of JP-B-5452166 in that two wafers can be aligned in one alignment device and be transferred at once by one wafer transferring robot. However, the alignment device described in JP-B-4720790 is different from the alignment device of JP-B-5452166 in following points.

That is, the alignment device described in JP-B-4720790 includes three layers of coaxial grip portions (corresponding to mounting tables) on which wafers are mounted and held. Two wafers held by any two of the grip portions are not rotated separately but together with each other to detect a notch position of each of the wafers. However, alignment of the two wafers based on information on the detected notch position is not performed at the same time but separately. First, a first wafer is brought after alignment, and a third wafer is mounted and held on a grip portion of a remaining layer. Next, a second wafer and the third wafer are rotated together to align the second wafer. Hereinafter, a description of detailed operation is omitted. However, in this alignment device, two wafers held by any two of the grip portions are rotated together to detect notch positions of the wafers, but the wafers are not aligned at the same time.

Since alignment of two wafers is not performed at the same time, there is still room for improving throughput of the alignment device described in JP-B-4720790.

Further, in the alignment device described in JP-B-4720790, there may also be a problem that a size and costs of the alignment device increase since an ID reading device of a wafer is different for each wafer.

Additionally, it is known that a mounting table on an alignment device, on which a wafer is mounted, is formed by directly cutting out a member that constitutes the mounting table, or by attaching a pad molded from an elastic material such as natural rubber or synthetic rubber to the mounting table.

As an example in which such a pad is used, JP-Y-2586261 discloses a suction pad including an attachment portion, a root portion expanding to the attachment portion, and a skirt portion integrally connected to the root portion. The root portion has a substantially circular cross section, and an outer periphery thereof gradually expands in diameter to connect the skirt portion. The skirt portion has a substantially circular cross section larger than the cross section of the root portion. A base portion from a start point to an end point of the skirt portion is integral with the skirt portion and becomes thinner gradually from the start point to the end point of the skirt portion. An inner bottom surface of the skirt portion is provided with, in a substantially central portion of a surface in contact with a work piece, a through hole reaching an opening from a bottom surface of the skirt portion.

JP-B-5379589 discloses a vacuum suction pad that is attached to a first attachment hole in a transferring arm of a substrate transferring device and that is connected to a vacuum suction path of the transferring arm to vacuum suction a substrate to the transferring arm.

However, there may be following problems when a wafer is held by a mounting table using the above pad.

In the suction pad of JP-Y-2586261, a part in contact with the work piece is reduced by thickening the base portion of the skirt portion. However, a contact area between the suction pad and the work piece tends to be smaller in recent years, so that a corresponding solution is required.

The vacuum suction pad of JP-B-5379589 is attached to an attachment hole of the transferring arm via a seal member, so that airtightness is ensured by the seal member. Therefore, the seal member also needs replacing when the vacuum suction pad is replaced, so that replacement work of the vacuum suction pad becomes complicated.

The present invention is made in view of the above circumstances, and an object of the present invention is to provide an alignment device capable of stably holding a wafer mounted on a mounting table of the alignment device and of facilitating replacement work such as attaching and detaching a pad member.

Another object of the present invention is to provide an alignment device capable of aligning a plurality of wafers at the same time with one alignment device and capable of reading IDs of the plurality of wafers. Another object of the present invention is to provide an alignment device that is compact and inexpensive with high throughput and is capable of performing alignment and ID reading safely without interference between adjacent wafers. Another object of the present invention is to provide a semiconductor wafer processing device including such an alignment device and an alignment method using the alignment device.

Means for Solving the Problems

In order to achieve the above objects, the present invention provides an alignment device for aligning notch portions at edges of wafers to a predetermined position in a circumferential direction, the alignment device including:

a plurality of mounting tables arranged side by side in a horizontal plane, on which the wafers are mounted;

a plurality of movement units configured to rotate the mounting tables respectively, and to move the mounting tables in a predetermined direction in the horizontal plane;

a plurality of notch portion detection units corresponding to the mounting tables, the notch portion detection units configured to detect respectively circumferential positions of the notch portions at the edges of the wafers mounted on the mounting tables; and a controller configured to detect respectively the circumferential positions of the wafers via the notch portion detection units, and to control positions of the mounting tables in the horizontal plane via the movement units to prevent interference between the wafers when rotating respectively the wafers mounted on the mounting tables via the movement units, so that the circumferential positions are aligned respectively at a position in a predetermined circumferential direction based on information on the circumferential positions, in which each of the plurality of mounting tables includes a mounting table main body portion and a pad member attached to an opening in the mounting table main body portion to hold the wafers.

in which the pad member further includes:

a main body portion attached to the opening, the main body portion including a through hole in a central portion thereof;

a first annular portion on a front end side of the pad member to abut against the wafers; and a first collar portion integrally provided with the first annular portion and the main body portion, the first collar portion being extended toward outside of the main body portion.

According to this configuration, the pad can be inserted into the opening (pad attachment hole) in the mounting table main body portion of the alignment device while being deformed. Therefore, attachment of the pad to the opening and detachment thereof from the opening is easy.

In the alignment device of the present invention, the pad member may further include:

a second annular portion on a rear end side of the pad member, the second annular portion having the same shape as the first annular portion; and a second collar portion integrally provided with the second annular portion and the main body portion, the second collar portion being seated in the main body portion.

According to this configuration, the first annular portion and the second annular portion have symmetric structures. Therefore, either of the first annular portion and the second annular portion may be a side to be in contact with a wafer. Further, erroneous installation when the pad is attached to the alignment device can be prevented, and attachment of the pad is easy.

In the alignment device of the present invention, the pad member may further include:

a third collar portion integrally provided with the main body portion on the rear end side of the pad member, the third collar portion being extended toward the outside of the main body portion.

According to this configuration, the pad can be easily attached to the opening of the mounting table main body portion with the third collar portion.

In the alignment device of the present invention, the mounting table main body portion may include a passage therein, one end portion of the passage being connected to the opening, and another end portion of the passage being connected to an intake and exhaust unit.

According to this configuration, when cycle time is insufficient due to a lack of no suction, the wafers can be held reliably by providing the intake and exhaust unit separately and performing vacuum-evacuation through the passage.

In the alignment device of the present invention, the main body portion may be a cylindrical member, and the first collar portion may include a tapered portion configured to expand in diameter from the first annular portion side toward the main body portion side.

In the alignment device of the present invention, the second collar portion may include a tapered portion configured to expand in diameter from the second annular portion side toward the main body portion side.

According to these configurations, the pad can be easily attached to the opening of the mounting table main body portion.

In the alignment device of the present invention, the pad member may be attached to the mounting table main body portion by clamping the mounting table main body portion with the first collar portion and the second collar portion.

According to this configuration, it is possible to prevent the pad from falling off the alignment device.

In the alignment device of the present invention, the pad member may be attached to the mounting table main body portion by clamping the mounting table main body portion with the first collar portion and the third collar portion.

According to this configuration, it is possible to prevent the pad from falling off the alignment device.

In the alignment device of the present invention, the pad member may be made of a conductive resin obtained by dispersing conductive particles in a resin composition.

According to this configuration, electrification of the wafer and accordingly sparking thereof can be prevented, and adhesion of particles to the wafers can be suppressed at the same time.

In the alignment device of the present invention, an outer diameter of the first annular portion may be smaller than an outer diameter of the main body portion.

According to this configuration, a contact area between the wafer and a contact surface (first annular portion) of the pad can be reduced. Therefore, the adhesion of particles to the wafers caused by contact between the wafers and the pad is suppressed.

The alignment device of the present invention may further include an ID reading unit at an intermediate position between the mounting tables, in which the controller is configured to read IDs attached to peripheral portions of the wafers via the ID reading unit, while detecting respectively the circumferential positions of the notch portions in the wafers via the notch portion detection units by rotating respectively the wafers mounted on the mounting tables via the movement units, and controlling the positions of the mounting tables in the horizontal plane at the same time via the movement units to prevent interference between the wafers.

In the alignment device of the present invention, the controller may include an interlock unit configured to control the positions of the mounting tables in the horizontal plane via the movement units to prevent interference between the wafers when the wafers mounted on the mounting tables are rotated by the movement units.

In the alignment device of the present invention, the controller may include an interlock unit configured to perform control to read an ID of one of the wafers, to control the positions of the mounting tables in the horizontal plane via the movement units, and to perform control to read an ID of another wafer, so as to prevent interference between the wafers when the ID reading unit reads the IDs of the wafers mounted on the mounting tables.

In the alignment device of the present invention, the controller may include an interlock unit configured to control the positions of the mounting tables in the horizontal plane via the movement units and to perform control to read the IDs of the wafers alternately by a time difference, so as to prevent interference between the wafers when the ID reading unit reads the IDs of the wafers mounted on the mounting tables.

In order to achieve the above objects, the present invention provides a semiconductor wafer processing device including the alignment device with the above configurations, the semiconductor wafer processing device further including:

a transferring device, in which the transferring device is configured to load the wafers to each of the plurality of mounting tables of the alignment device that are arranged side by side in the horizontal plane and to bring the wafers from the mounting tables.

In the semiconductor wafer processing device of the present invention, the transferring device may be a double arm robot.

In order to achieve the above objects, the present invention provides an alignment method in which the alignment device with the above configurations is used to align the wafers, the alignment method including:

loading the plurality of wafers respectively into the plurality of mounting tables arranged side by side in the horizontal plane;

holding the wafers via the pad member respectively attached to the plurality of mounting tables;

detecting the notch portions of the wafers on the mounting tables while rotating the mounting tables;

moving positions of the notch portions detected in the notch portion detection to a position in a predetermined circumferential direction by further rotating the mounting tables;

first controlling the positions of the mounting tables to prevent interference between the wafers when moving the wafers in the alignment, and unloading the wafers on the plurality of mounting tables respectively from the plurality of alignment device to bring the wafers outside of the alignment devices with an external unloading device.

In the alignment method of the present invention, (i) the wafer loading, the wafer unloading, or the notch portion detecting in an area of one of the mounting tables, and (ii) the wafer loading, the wafer unloading, or the notch portion detecting in an area of another of mounting tables may be performed continuously or partially overlapped.

In the alignment method of the present invention, when the notch portion detecting determines that a position displacement amount of a wafer relative to a mounting table is beyond a specified range, the wafer may be brought from the alignment device.

The alignment method of the present invention may further include reading IDs attached respectively to the plurality of wafers by an ID reading unit at an intermediate position between the plurality of tables.

The alignment method of the present invention may further include second controlling the positions of the mounting tables to prevent interference between the wafers in the ID reading.

The alignment method of the present invention may further include second controlling to restrict movement of another of the wafers to the ID reading unit during reading ID of one of the wafers, and enabling the movement of another of the wafers to the ID reading unit after reading the ID of one of the wafers, so as to prevent interference between the wafers in the ID reading.

In the alignment method of the present invention, the mounting tables in the horizontal plane may be moved to a bringing position to bring the wafers after reading the ID, so as to perform the alignment.

Effect of Invention

According to the present invention, it is possible to provide an alignment device capable of stably holding a wafer mounted on a mounting table of the alignment device and capable of facilitating replacement work such as attaching and detaching a pad member.

According to the present invention, it is possible to provide an alignment device that is compact and inexpensive with high throughput and is capable of aligning a plurality of wafers at the same time. It is also possible to prevent an accident in which expensive wafers are damaged due to collision with each other during alignment operation or ID reading operation.

DESCRIPTION OF EMBODIMENTS

Hereinafter, an alignment device and a pad member according to an embodiment of the present invention are described with reference to the drawings.

First, a pad 1 (an example of the pad member) according to the embodiment is described with reference to FIGS. 1 to 4. The pad 1 is used as, for example, a component that holds a wafer that is a material for manufacturing a semiconductor element. The pad 1 is provided in an alignment device for aligning a notch portion at an edge of a wafer to a predetermined position in a circumferential direction. The pad 1 may be attached to a plurality of mounting tables on which a wafer is mounted. Details of the alignment device are described below.

Figure 1:
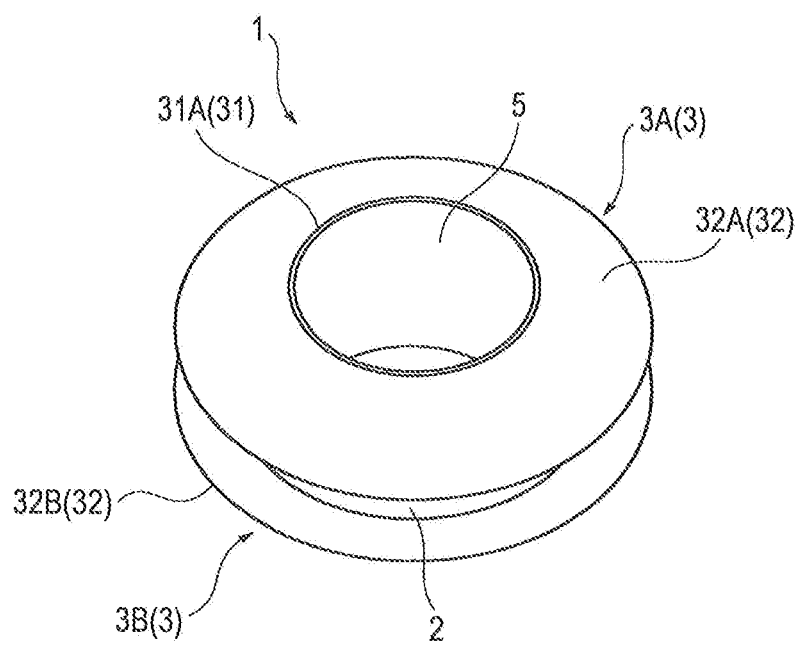
FIG. 1 is a perspective view of a pad according to the present invention.
Figure 2:
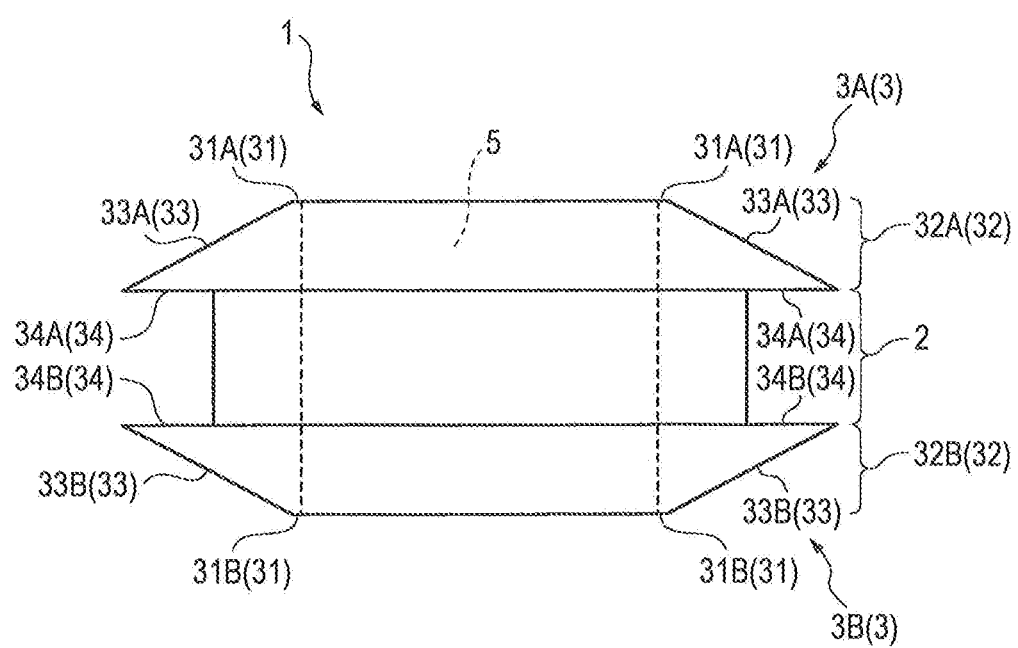
FIG. 2 is a front view of the pad.
Figure 3:
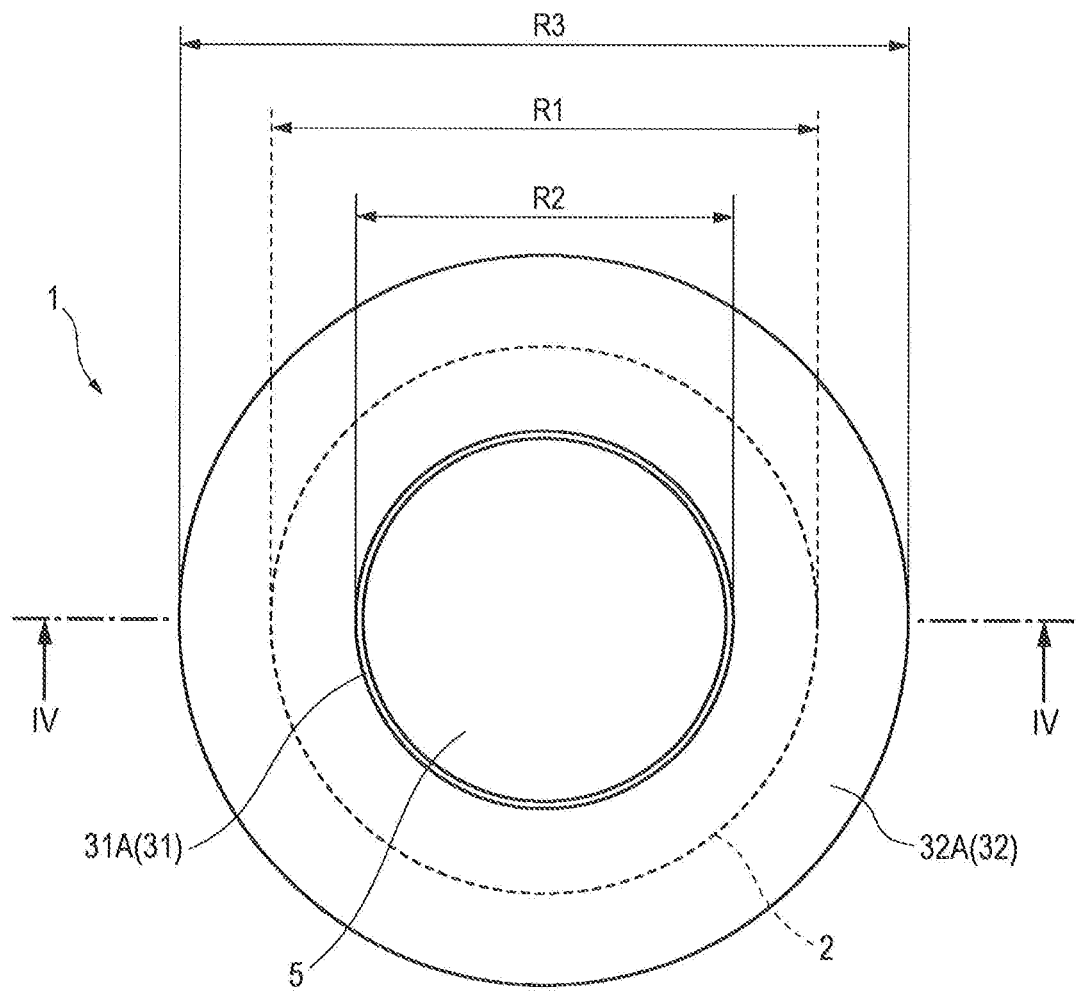
FIG. 3 is a top view of the pad.
Figure 4:
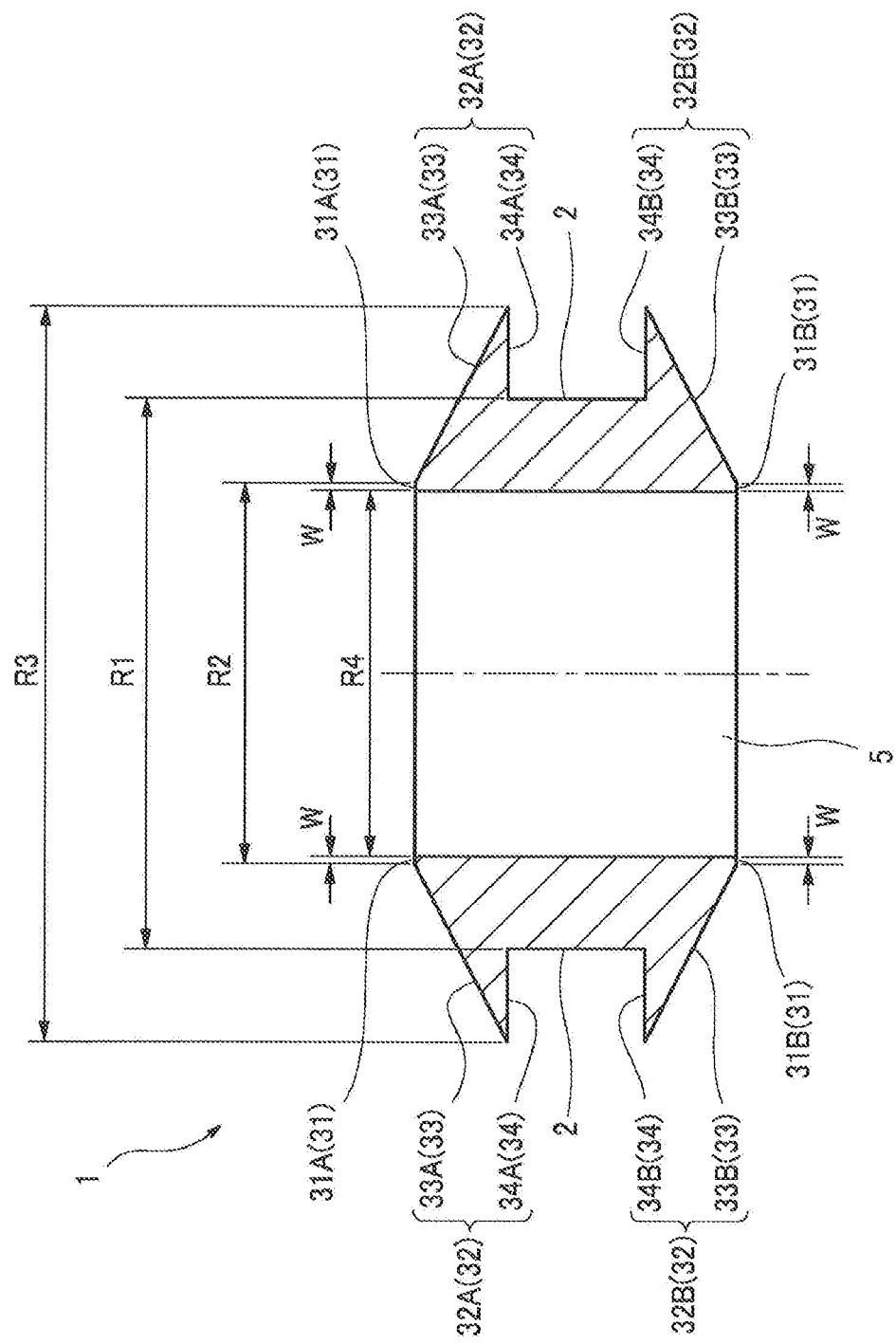
FIG. 4 is a cross sectional view taken along a line IV-IV in FIG. 3.

As illustrated in FIGS. 1 to 4, the pad 1 includes a main body portion 2 at a central portion and a holding portion 3 at both end portions of the main body portion 2 in a height direction (vertical direction in FIG. 2). The holding portion 3 in the present embodiment includes a first holding portion 3A at one end portion (for example, an upper end portion in FIGS. 2 and 4) of the main body portion 2 and a second holding portion 3B at an end portion (for example, a lower end portion in FIGS. 2 and 4) opposite to the first holding portion 3A. The main body portion 2 and holding portions 3A and 3B are formed integrally.

The main body portion 2 is in a cylindrical shape. A height of the main body 2 is set to be, for example, substantially the same as a thickness (a vertical height in FIG. 11) of a mounting table main body portion 301 in an opening 302 (see FIG. 11) to be described below. The height of the main body 2 is, for example, substantially 1 to 2 mm. An outer diameter R1 of the main body 2 is the same as or slightly larger than an inner diameter of the opening 302 (see FIG. 11) to be described below. Preferably, the outer diameter R1 of the main body 2 is slightly larger than the inner diameter of the opening 302. This increases a degree of adhesion of the main body 2 to the opening 302 during attachment of the pad 1 to be described below.

A central portion of the main body portion 2 and a central portion of the holding portion 3 (3A, 3B) are formed with a through hole 5 to connect and penetrate through the main body portion 2 and the holding portion 3 (3A, 3B). The through hole 5 in the present embodiment has a circular cross section and a uniformed diameter in a height direction of the pad 1.

The holding portion 3 (3A, 3B) includes an annular portion 31 (31A, 31B) that abuts against a wafer or the like when the wafer or the like is held (mounted) as a target member. The annular portion 31 (31A, 31B) has an annular shape at an edge portion of the through hole 5. An annular portion 31A and an annular portion 31B may have substantially the same shape. In the present embodiment, the annular portion 31A and the annular portion 31B respectively have circular shapes having the same diameter. An outer diameter R2 of the annular portion 31 (31A, 31B) is smaller than the outer diameter R1 of the main body portion 2. In other words, the outer diameter R2 of the annular portion 31 (31A, 31B) is slightly larger (by a value of a radial width W to be described below) than a diameter R4 (see FIG. 4) of the through hole 5. The annular portion 31 (31A, 31B) is a substantially flat surface orthogonal to the height direction of the main body portion 2. A wafer is held in contact with any one of the annular portion 31A (an example of a first annular portion) of the first holding portion 3A or the annular portion 31B (an example of a second annular portion) of the second holding portion 3B.

The holding portion 3 (3A, 3B) includes a collar portion 32 (32A, 32B) integrally provided with the main body 2 and the annular portion 31 (31A, 31B) and between the main body 2 and the annular portion 31 (31A, 31B). The collar portion 32 (32A, 32B) includes a tapered portion 33 (33A, 33B) and a seating surface 34 (34A, 34B). The tapered portion 33 (33A, 33B) expands in diameter from the annular portion 31 (31A, 31B) side toward the main body portion 2 side. The seating surface 34 (34A, 34B) is a part of the collar portion 32 (32A, 32B) in contact with the main body 2, and is parallel to a surface orthogonal to the height direction of the main body 2. That is, an outer diameter R3 of the collar portion 32 (32A, 32B) is larger than the outer diameter R1 of the main body 2. The seating surface 34 (34A, 34B) abuts against a part of mounting tables 202a and 202b when the pad 1 is attached to the mounting tables 202a and 202b.

In this way, the holding portion 3 (3A, 3B) has a truncated cone shape. The first holding portion 3A at an upper end portion of the main body portion 2 has a decreasing diameter toward the annular portion 31A. The second holding portion 3B at a lower end portion of the main body portion 2 has a decreasing diameter toward the annular portion 31B. The first holding portion 3A and the second holding portion 3B are symmetrical with the main body portion 2 interposed in between the first and second holding portions 3A and 3B. Although illustration is omitted, a bottom view of the pad 1 is the same as the top view illustrated in FIG. 3. Further, a rear view and left and right side views of the pad 1 are the same as the front view illustrated in FIG. 2.

An area of the annular portion 31 (31A, 31B) is, for example, 0.1 to 1 square millimeter (mm2) or less. When the area of the annular portion 31 (31A, 31B) is less than 0.1 mm2, contact failure with a wafer may occur. Meanwhile, when the area of the annular portion 31 (31A, 31B) is larger than 1 mm2, adhesion of particles to the wafer may be problematic. For example, when the diameter R4 of the through hole 5 is 4 mm, the radial width W of the annular portion 31 (31A, 31B) is 0.01 to 0.065 mm. Further, the area of the annular portion 31 (31A, 31B) varies according to an allowable total contact area S between all pads 1 and a wafer, that is, the number of pad 1. When the allowable total contact area S between all the pads 1 and the wafer is constant, an area of each annular portion 31 (31A, 31B) is reduced to S, S/2, S/3 . . . as the number of pads 1 increases. In other words, when the allowable total contact area S between all the pads 1 and the wafer is determined and the number of pads 1 attached to the mounting tables 202a and 202b of the alignment device 200 is determined, the area of the annular portion 31 (31A, 31B) is uniquely determined.

Specifically, for example, when the total contact area S is 3 mm2 or less, the number of pads 1 is 3, the diameter R4 of the through hole 5 is 4 mm, and the outer diameter R2 of the annular portion 31 (31A, 31B) is 4.13 mm, the radial width W of the annular portion 31 (31A, 31B) is 0.065 mm. At this time, the area of the annular portion 31 (31A, 31B) is 0.83 mm2, the total area of the annular portion 31 is 2.49 mm2, satisfying the total contact area S (3 mm2 or less). Further, for example, when the total contact area S is 0.5 mm2 or less, the number of the pads 1 is 3, the diameter R4 of the through hole 5 is 4 mm, and the outer diameter R2 of the annular portion 31 (31A, 31B) is 4.02 mm, the radial width W of the annular portion 31 (31A, 31B) is 0.01 mm. At this time, the area of the annular portion 31 (31A, 31B) is 0.13 mm2, the total area of the annular portion 31 is 0.39 mm2, satisfying the total contact area S (0.5 mm2 or less).

The main body portion 2 and the holding portion 3 (3A, 3B) constituting the pad 1 are made of a conductive resin obtained by dispersing conductive particles in a resin composition. For example, the main body portion 2 and the holding portion 3 (3A, 3B) may be made of a fluorine resin such as polytetrafluoroethylene, perfluoroalkoxy alkane, and ethylene tetrafluoroethylene copolymer. All resins usually used in pads of robot hands that handle semiconductor wafers may be applied as the resin composition.

Next, the alignment device 200 including the mounting tables 202a and 202b to which the pad 1 is attached is described with reference to FIGS. 5 to 13.

The alignment device 200 according to the present embodiment is included in a semiconductor wafer processing device. The alignment device 200 aligns a wafer received from a transferring device (robot) in the semiconductor wafer processing device and reads an ID attached to a peripheral portion of the wafer at the same time. Alignment of a wafer is performed by aligning a circumferential position of a notch portion (such as a notch or an orientation flat) at an edge of the wafer to a predetermined position in the circumferential direction.

(Sorter)

Figure 5:
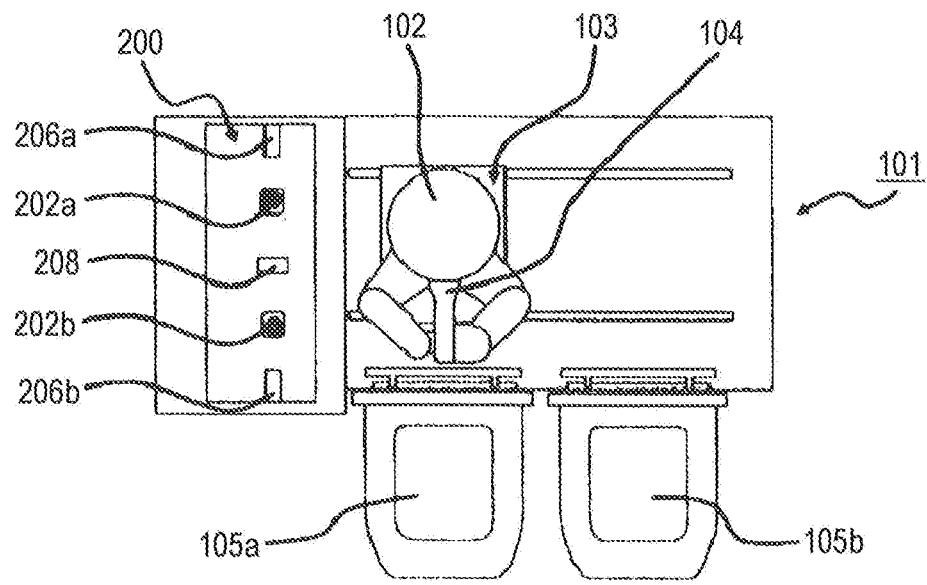
FIG. 5 is a top view of a sorter on which an alignment device of the present invention is installed.

In practice, such an alignment device 200 is used by being installed in a special device called a sorter. The sorter is arranged at a position where a wafer is loaded into or unloaded from the semiconductor wafer processing device. FIG. 5 is a top view illustrating a sorter 101.

As illustrated in FIG. 5, the sorter 101 includes two load ports 105a and 105b attached to a front surface thereof, and one wafer transferring robot 103 and one alignment device 200 therein. The alignment device 200 is installed at an end portion (left end portion in FIG. 5) in an internal space of the sorter 101. The robot 103 travels in rest space of the alignment device 200 to transfer a wafer 102. The robot 103 is a robot of a double-arm type (double-arm robot), and includes a pair of arms 104.

Lid opening and closing mechanisms are interposed between inside of the sorter 101 and the load port 105a, and between inside of the sorter 101 and the load port 105b, respectively. When containers (for example, FOUPs) that stock a plurality of wafers 102 are mounted on these load ports, the lid opening and closing mechanisms open lids of the containers in a state in which inflow of outside air is blocked. Accordingly, an internal space of the FOUPs and the internal space of the sorter 101 is always kept in a clean working environment.

Here, when one FOUP that stocks a plurality of wafers 102 having random orientations is mounted on one load port 105a, a lip of the FOUP is opened by the lid opening and closing mechanism. The robot 103 brings two wafers 102 up from the FOUP and transfers the two wafers to the alignment device 200. The alignment device 200 aligns orientations of the two wafers 102 in a predetermined direction and reads IDs embedded on the wafers 102 at the same time.

Here, "orientation" of the wafer 102 refers to a crystal orientation thereof. In the present embodiment, the "orientation" of the wafer 102 is synonymous with the "circumferential position" of a notch portion of the wafer 102. The orientation of the wafer 102 is "aligned in a predetermined direction" means that the "circumferential position" thereof "is positioned at a predetermined position (reference position)", so that the alignment of the wafer 102 is completed.

Next, the robot 103 brings the two wafers 102 whose orientations are aligned in the predetermined direction from the alignment device 200, and transfers the wafers 102 to another FOUP at the other load port 105b.

A lid of the other FOUP is closed by the lid opening and closing mechanism when a predetermined number of wafers 102 whose orientations are aligned in a predetermined orientation are stocked in the FOUP. The FOUP is then transferred to a next processing step by an external robot.

(Alignment Device)

Figure 6:
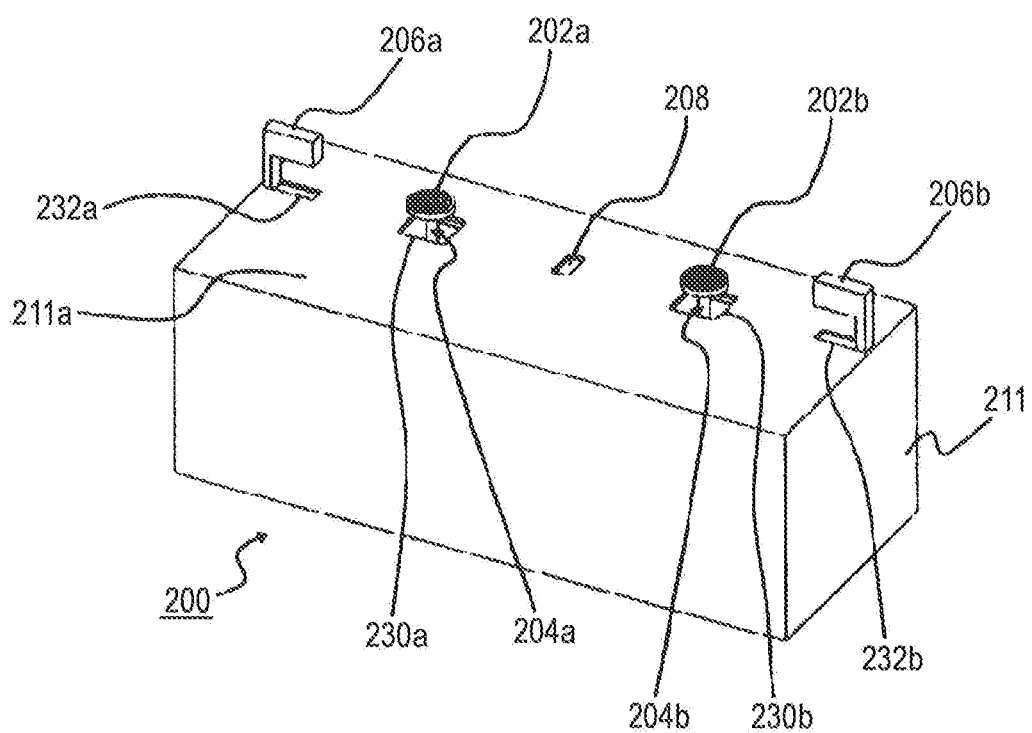
FIG. 6 is a perspective view of the alignment device of the present invention.

Next, a structure of the alignment device 200 is described in detail with reference to FIGS. 6 to 8.

Figure 7:
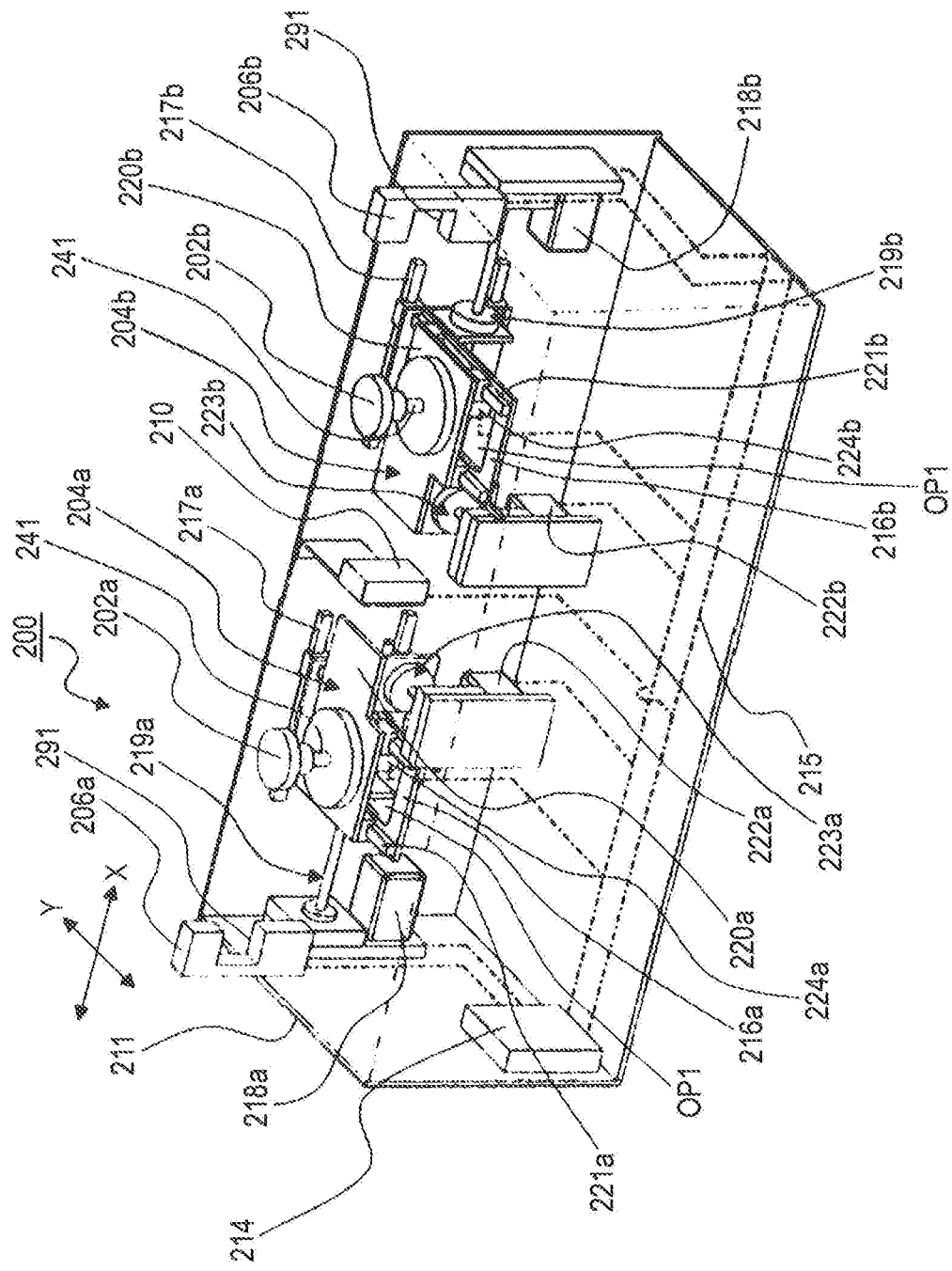
FIG. 7 is an enlarged perspective view of inside of the alignment device when a ceiling plate, a front plate, and a right side plate of a base box thereof are removed.

The alignment device 200 includes two mounting tables 202a and 202b on which wafers 102a and 102b (see FIG. 8) are mounted, two movement units 204a and 204b, two notch portion detection units 206a and 206b, one ID reading unit 208, and a controller 210 (see FIG. 7). The mounting tables 202a and 202b are arranged side by side in a horizontal plane. The movement units 204a and 204b rotate the mounting tables 202a and 202b respectively, and move the mounting tables 202a and 202b in a predetermined direction in the horizontal plane. The notch portion detection units 206a and 206b are corresponding to the mounting tables 202a and 202b, and detect circumferential positions of notch portions 112 (see FIGS. 8 and 9) at edges of the wafers 102a and 102b mounted on the mounting tables 202a and 202b respectively. The ID reading unit 208 reads IDs of the wafers 102a and 102b.

Figure 8:
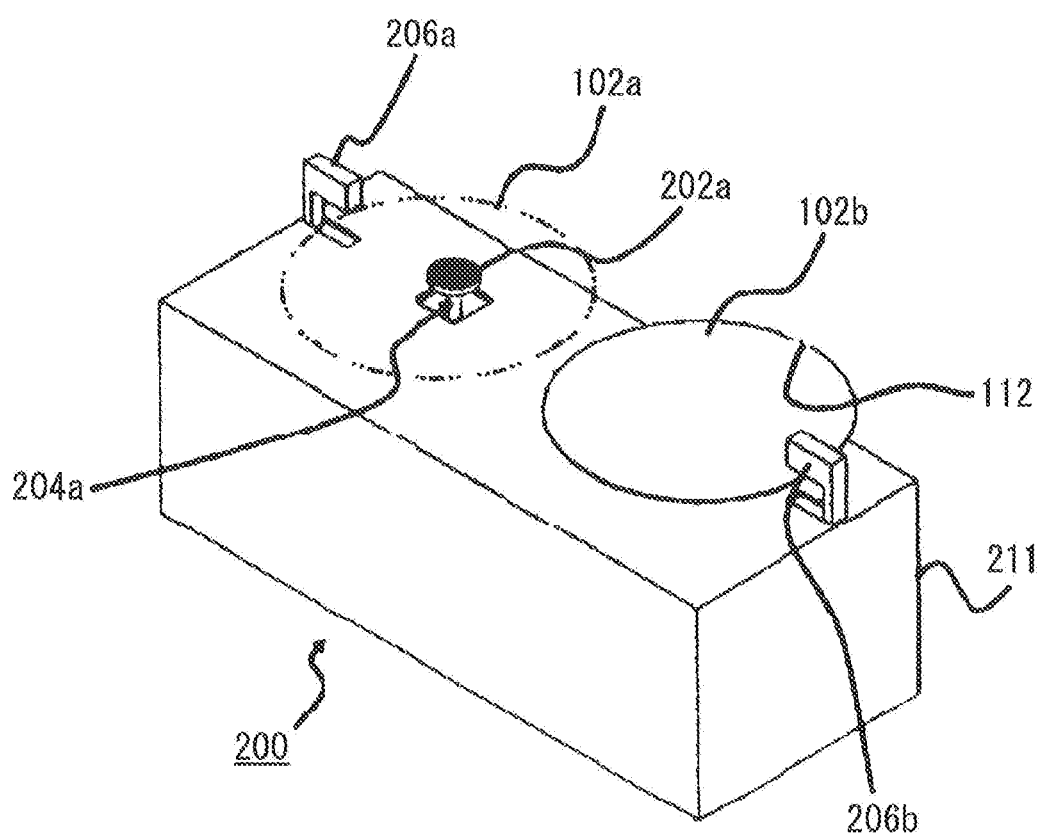
FIG. 8 is a perspective view of a state in which two wafers are mounted on the alignment device and one wafer is illustrated in an imaginary line (two-dot chain line)

In FIG. 8, only an outline of the wafer 102a mounted on the mounting table 202a is depicted by a two-dot chain line. This is for easy understanding of a position relationship between the wafer 102a and the mounting table 202a. A reference numeral 215 in FIG. 7 denotes wiring extending from the controller 210 to various devices.

The mounting tables 202a and 202b are protruded from openings 230a and 230b in a ceiling plate 211a of a box-shaped base 211 of the alignment device 200. The mounting tables 202a and 202b include the pads 1 (not illustrated in FIG. 6) that suction and hold the wafers 102a and 102b mounted thereon.

The notch portion detection units 206a and 206b are at both left and right end portions of the alignment device 200. Similar to the mounting tables 202a and 202b, upper half portions of C-shaped notch portions (described below) of the notch portion detection units 206a and 206b are protruded from openings 232a and 232b in the ceiling plate 211a of the box-shaped base 211 of the alignment device 200.

The ID reading unit 208 is at an intermediate position between the two movement units 204a and 204b. More specifically, the ID reading unit 208 is located at the intermediate position between the two movement units 204a and 204b and immediately below a square hole in the ceiling plate 211a of the box-shaped base 211. The ID reading unit 208 is capable of reading the ID attached to the peripheral portion of the wafer 102 through the hole. Here, the peripheral portion of the wafer 102 refers to an outer peripheral portion of the wafer 102 including an edge of the wafer 102.

(Detailed Structure of Movement Unit)

Next, a structure of the movement units 204a and 204b is described in detail with reference to FIG. 7. The movement unit 204a and the movement unit 204b have the same structure and are symmetrical. Therefore, in following description, only the movement unit 204a is described in detail, and description of the movement unit 204b is omitted.

In FIG. 7, arrows X and Y indicate horizontal directions orthogonal to each other. An arrow X indicates a width direction which is a first horizontal direction, and an arrow Y indicates a depth direction which is a second horizontal direction.

The movement unit 204a is a mounting table drive mechanism that rotates the mounting table 202a and moves the mounting table 202a in a predetermined direction in the horizontal plane at the same time in a state in which the wafer 102a is mounted on the mounting table 202a. The movement unit 204a includes a mounting table drive motor 224a, an X-axis slider 216a, and a Y-axis slider 220a.

The mounting table drive motor 224a is on a lower surface of the Y-axis slider 220a, and an output shaft 241 of the mounting table drive motor 224a is protruded from an opening (not illustrated) in the Y-axis slider 220a. A tip end of the output shaft 241 is coupled to the mounting table 202a, so that the mounting table 202a is rotated by rotation of the mounting table drive motor 224a. The mounting table drive motor 224a is inserted into an opening OP 1 in a center of the X-axis slider 216a. In this way, the mounting table drive motor 224a does not interfere with the X-axis slider 216a as the Y-axis slider 220a moves.

The Y-axis slider 220a is driven by a Y-axis drive ball screw unit 223a in a Y-axis direction and slides above a pair of left and right Y-axis linear guides 221a and 221a on the X-axis slider 216a.

The Y-axis drive ball screw unit 223a is fixed to the X-axis slider 216a via a bracket. A ball screw of the Y-axis drive ball screw unit 223a is screwed by rotation of a Y-axis drive motor 222a. As described above, the Y-axis slider 220a slides above the pair of left and right Y-axis linear guides 221a and 221a, and moves in the Y-axis direction.

The X-axis slider 216a is driven by an X-axis drive ball screw unit 219a in an X-axis direction and slides above a pair of upper and lower X-axis linear guides 217a and 217a on a rear wall of the box-shaped base 216a.

The X-axis drive ball screw unit 219a is fixed to a left wall of the box-shaped base 211. A ball screw of the X-axis drive ball screw unit 219a is screwed by rotation of an X-axis drive motor 218a. As described above, the X-axis slider 216a slides above the pair of upper and lower X-axis linear guides 217a and 217a, and moves in the X-axis direction.

(Operation of Movement Unit)

The movement unit 204a controls the mounting table drive motor 224a via the controller 210 to rotate the mounting table 202a on which the wafer 102a is mounted, and controls the X-axis drive motor 218a and the Y-axis drive motor 222a via the controller 210 at the same time to move the X-axis slider 216a and the Y-axis slider 220a in the predetermined direction in the horizontal plane. As a result, the mounting table 202a on which the wafer 102a is mounted is moved in a predetermined direction in the horizontal plane.

(Detailed Structure of Notch Portion Detection Unit)

As illustrated in FIG. 7, each of the notch portion detection units 206a, 206b includes a notch 291 at a central portion in a length direction of a rectangular component elongated in a vertical direction. The entire notch 291 has a C-shaped outer shape. The notch portion detection units 206a and 206b are arranged such that notches 291 face each other. The edges of the wafers 102a and 102b mounted on the mounting tables 202a and 202b pass through the notches 291 (see FIG. 8). A laser light projecting unit that faces the notch portion 291 is on one of an upper part or a lower part of each of the notch portion detection units 206a and 206b, and a laser light receiving unit is on the other part.

(Operation of Notch Portion Detection Unit)

The notch portion detection units 206a and 206b irradiate laser light projected from the laser light projecting unit to the edges of the rotating wafers 102a and 102b that pass through the notches 291 respectively. Accordingly, a change in an outline shape of the edge of the wafer 102 is continuously detected. A notch portion (notch, orientation flat, or the like) at the edge is detected by a change in an amount of laser light received by the light receiving unit through the edge, so that a circumferential position thereof is detected. At the same time, center positions of the wafers 102a and 102b are detected respectively by diameters of the wafers 102a and 102b known in advance as well as incident angles and incident depths of laser light to the wafers 102a and 102b passing through the notches 291.

(Detailed Structure of Pad Attached to Mounting Table)

Next, the mounting tables 202a and 202b to which the pads 1 are attached are described with reference to FIGS. 9 to 11.

Figure 9:
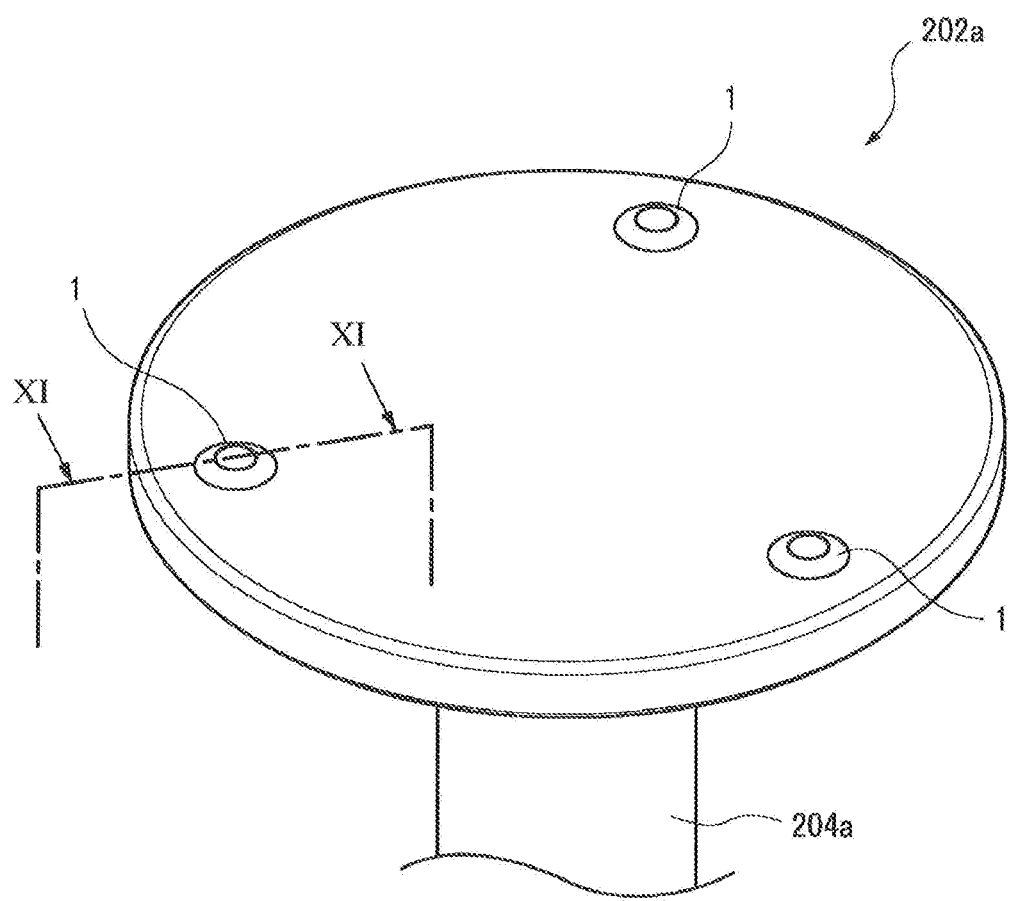
FIG. 9 is a perspective view illustrating an example of a mounting table of the alignment device.

FIG. 9 is a perspective view illustrating the mounting table 202a to which the pads 1 are attached. FIG. 10 is a view illustrating the mounting table 202a when a wafer is mounted thereon. FIG. 11 is an XI-XI cross sectional view of the mounting table 202a to which the pad 1 is attached. As described above, since the mounting tables 202a and 202b have substantially the same structure, the mounting table 202a is representatively described below.

Figure 10:
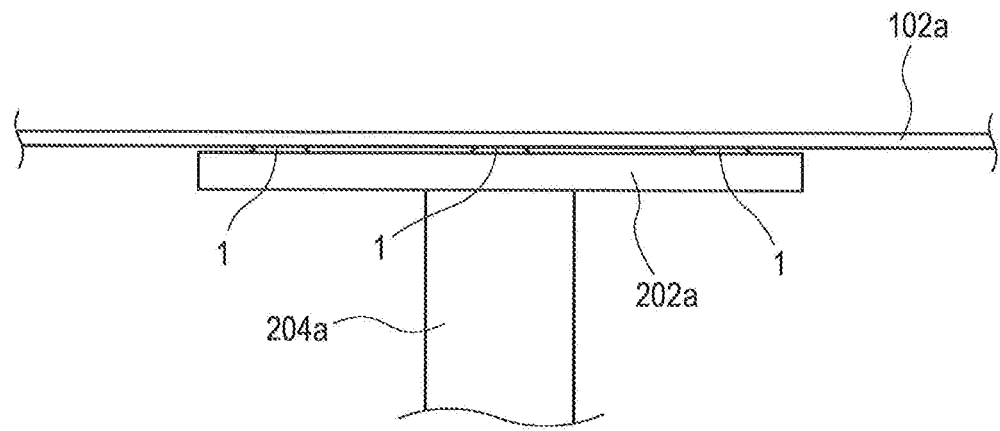
FIG. 10 is a view illustrating the mounting table on which a wafer is mounted.

As illustrated in FIGS. 9 and 10, a plurality of (three in the present embodiment) pads 1 for holding the wafer 102a are attached to the mounting table 202a. The mounting table 202a includes an intake and exhaust unit (not illustrated), and each of the pads 1 is connected to the intake and exhaust unit. The pads 1 attached to the mounting table 202a hold the wafer 102a by vacuum-suctioning the wafer 102a, so that the wafer 102a is not displaced relative to or falls from the mounting table 202a. The mounting table 202a is made of a ceramic material such as alumina.

Figure 11:
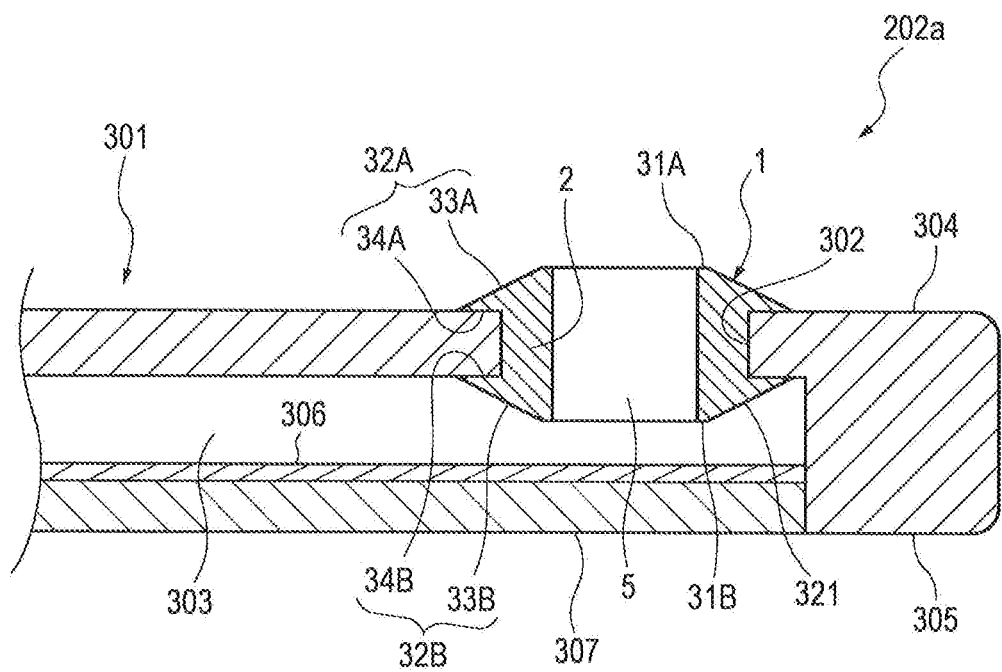
FIG. 11 is a cross sectional view taken along a line XI-XI in FIG. 9.

As illustrated in FIG. 11, the mounting table 202a includes a mounting table main body portion 301, an opening 302 for attaching the pad 1, a passage 303 (a part of the intake and exhaust unit) connected to the opening 302, and a mounting surface 304 that is a surface on which the wafer 102a is mounted.

The opening 302 is a hole in the mounting surface 304 (an upper surface in FIG. 11) that is a surface on which the wafer 102a is held on the mounting table main body portion 301. The opening 302 is connected to the passage 303. The opening 302 in the present embodiment has a circular cross section and a uniformed diameter in a thickness direction of the mounting table main body portion 301 in the opening 302. The diameter of the opening 302 is substantially the same as the outer diameter R1 of the main body 2 of the pad 1.

In the passage 303, there is a groove in a surface (inner surface) 305 opposite to the mounting surface 304 of the mounting table main body portion 301, and the groove is sealed by a lid member (sealing member) 306. A surface of the lid member (sealing member) 306 opposite to the passage 303 is supported by a base 307. An end portion (a left end portion in FIG. 11) of the passage 303 is connected to the intake and exhaust unit (not illustrated).

The holding portion 3 (3A or 3B) on any side of the pad 1 is inserted into the opening 302 from the mounting surface 304 side of the mounting table main body portion 301 while being elastically deformed. At this time, since the collar portion 32 (32A, 32B) includes the tapered portion 33 (33A, 33B), the holding portion 3 (3A or 3B) is guided into the opening 302 while being automatically adjusted. Then, a maximum diameter part 321 (see FIG. 11) of the collar portion 32 (32A, 32B) is folded back toward the main body portion 2 and is elastically deformed, and is elastically deformed to an original shape thereof after passing through the opening 302 completely, so that the holding portion 3 (3A or 3B) comes into close contact with a lower edge of the opening 302. For example, when the second holding portion 3B is inserted into the opening 302, the collar portion 32B (the tapered portion 33B) of the second holding portion 3B enters the opening 302, so that the second holding portion 3B (the annular portion 31B and the collar portion 32B) is in the passage 303. Accordingly, the seating surface 34B of the second holding portion 3B arranged in the passage 303 is abutted (seated) against an inner wall surface of the passage 303 (an upper surface of the passage 303 in FIG. 11).

At this time, the main body portion 2 of the pad 1 is abutted against an inner peripheral surface of the opening 302, so that both are in close contact with each other. Further, the first holding portion 3A, which is not inserted into the opening 302, is outside of the opening 302 (above the mounting surface 304 in FIG. 11), so that the seating surface 34A of the first holding portion 3A is attached to be in contact with the mounting surface 304. That is, the pad 1 is attached to be in securely close contact with the mounting table main body portion 301 by clamping the mounting table main body portion 301 with the collar portion 32A of the first holding portion 3A and the collar portion 32B of the second holding portion 3B. In this way, an attaching position of the pad 1 attached to the mounting table 202a is defined to an appropriate position by the collar portion 32A of the first holding portion 3A and the collar portion 32B of the second holding portion 3B.

When the pad 1 is attached to the mounting table 202a via the opening 302, the through hole 5 of the pad 1 is connected to the passage 303 of the mounting table 202a. In this state, air in the through hole 5 and the passage 303 is vacuum-evacuated by operation of the intake and exhaust unit, and the wafer 102a is accordingly vacuum-suctioned onto the annular portion 31A of the pad 1 attached to the mounting table 202a.

In the present embodiment, three pads 1 are attached to one mounting table 202a. Therefore, a contact area between the pads 1 (the annular portion 31A) and the wafer 102a on the mounting table 202a is 3 mm2 or less.

(Alignment Method)

Next, an alignment method of the wafers 102a and 102b following operation of the alignment device 200 is described in detail with reference to FIGS. 12A to 12C and in an order of steps in a flow chart in FIG. 13. The alignment method includes: transferring the wafers 102a and 102b to the alignment device 200; detecting the notch portions 112 in the wafers 102a and 102b in the alignment device 200; reading the IDs of the wafers 102a and 102b; aligning the wafers 102a, 102b; and bringing the wafers 102a and 102b from the alignment device 200. In FIG. 13, the wafer 102a is referred to as a "first wafer", the wafer 102b is referred to as a "second wafer", and the mounting table 202a is referred to as a "first mounting table".

(Wafer Transferring—Receiving Wafer)

First, the wafers 102a and 102b are transferred (loaded) respectively to the mounting tables 202a and 202b by the robot 103 (see FIG. 5) (Step S1).

Figure 12A:
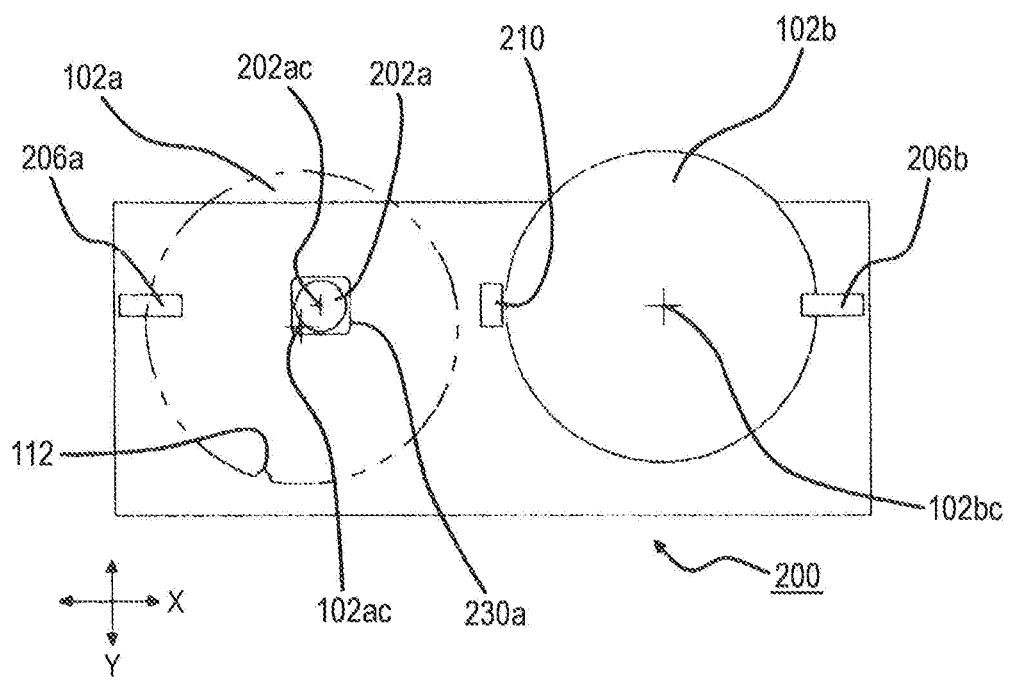
FIG. 12A is a top view of the alignment device immediately after receiving two wafers.
Figure 13:
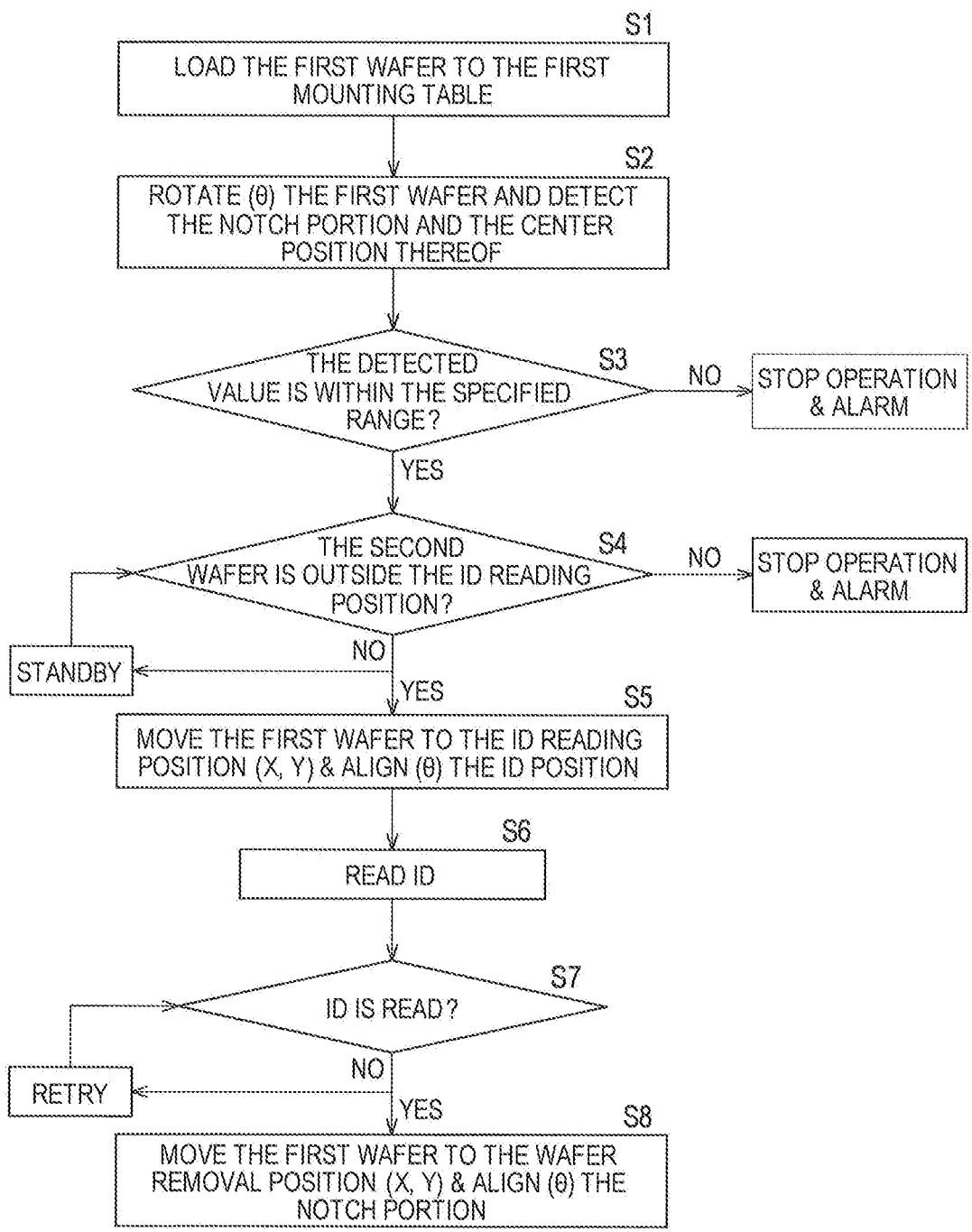
FIG. 13 is a flowchart of alignment operation and ID reading operation in the alignment device.

FIG. 12A illustrates a state of the alignment device 200 immediately after the wafers 102a and 102b are transferred to the alignment device 200. The wafers 102a and 102b received on the mounting tables 202a and 202b are vacuum-suctioned on the pads 1 (see FIG. 9) attached respectively to the mounting tables 202a and 202b.

In FIG. 12A, only the outline of the wafer 102a mounted on the mounting table 202a is depicted by a two-dot chain line for easy understanding of the position relationship between the wafer 102a and the mounting table 202a. The mounting table 202b is not illustrated. The same depiction and illustration omission also applies to FIGS. 12B and 12C.

In this way, when the wafers 102a and 102b are mounted on the alignment device 200, as illustrated in FIG. 12A, the mounting table 202a receiving the wafer 102a is at an initial position (a starting point: a center of the opening 230a). In contrast, a center position 102ac of the wafer 102a on the mounting table 202a is normally deviated from a center position 202ac of the mounting table 202a.

In this way, a state of two deviating center positions 102ac and 202ac also applies to the wafer 102b and the mounting table 202b.

(Notch Portion Detecting—Detecting Notch Portion and Center Position of Wafer)

Next, the alignment device 200 detects the notch portions 112 of the wafers 102a and 102b and center positions 102ac and 102bc (Step S2).

The detection is performed as follows. That is, the controller 210 rotates the mounting tables 202a and 202b via the movement units 204a and 204b, so that the wafers 102a and 102b mounted on the mounting tables 202a and 202b are rotated. At the same time, via the notch portion detection units 206a and 206b, the controller 210 detects circumferential positions of the notch portions 112 at the edges of the wafers 102a and 102b that pass through the notches 291 of the notch portion detection units 206a and 206b while being rotated, and detects the center positions 102ac and 102bc of the wafers 102a and 102b. The detection is performed on the two wafers 102a and 102b at the same time in the same sequence.

Here, the circumferential positions of the notch portions 112 in the wafers 102a and 102b refer to relative positions of the notch portions 112 relative to the starting point of a rotation angle of the mounting tables 202a and 202b. The center positions 102ac and 102bc of the wafers 102a and 102b refer to positions of the wafers 102a and 102b relative to the center positions 202ac and 202bc of the mounting tables 202a and 202b.

Next, the controller 210 determines whether the detected center positions 102ac and 102bc of the wafers 102a and 102b are within a predetermined range of a specified value (Step S3).

When it is determined that the center positions 102ac and 102bc of the wafers 102a and 102b are beyond the range of a specified value (No in Step S3), the controller 210 determines that a position displacement amount of a center position of a corresponding wafer is beyond a specified range, so that the wafer is regarded as abnormal. Then, the controller 210 stops operation of the alignment device 200 and issues an alarm. At this time, the wafer regarded as abnormal is removed from the alignment device 200, and the wafer transferring process is retried.

Such determination and device operation based on the determination may also be performed in Step S2.

(ID Reading—Reading ID of Wafer)

Meanwhile, if it is determined in Step S3 that the center positions 102ac and 102bc of the wafers 102a and 102b are within the predetermined range of a specified value (YES in Step S3), the alignment device 200 reads the IDs of the wafers 102a and 102b (Steps S4 to S6).

Figure 12B:
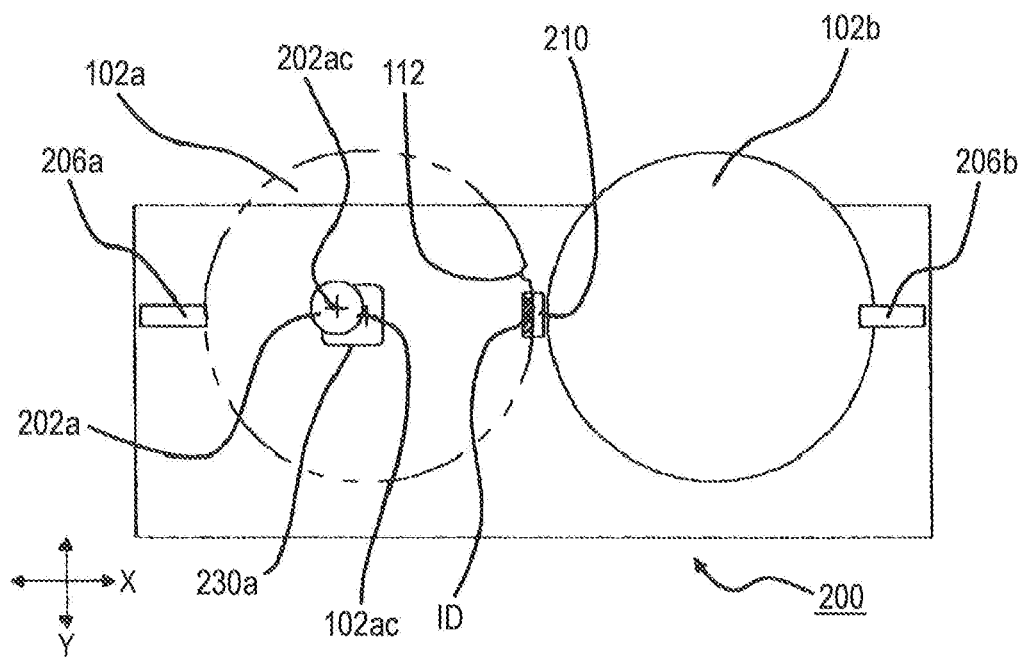
FIG. 12B is a top view of the alignment device when a wafer is at an ID reading position.

FIG. 12B illustrates a state in which the wafer 102a is moved to an ID reading position. Hereinafter, operation of the alignment device 200 to read the ID of the wafer 102a is described with reference to FIG. 12B.

(ID Reading Preparation)

First, the alignment device 200 reads the ID of the wafer 102a. At this time, the controller 210 determines whether the wafer 102b is outside the ID reading position before the wafer 102a is moved to the ID reading position (Step S4).

When it is determined that the wafer 102b is not outside the ID reading position (at the ID reading position) (No in Step S4), the controller 210 moves the wafer 102b while waiting for the wafer 102a to be moved to the ID reading position, so as to prevent interference between the wafers 102a and 102b. Specifically, the controller 210 controls a position of the mounting table 202b in the horizontal plane via the movement unit 204b, and moves the wafer 102b mounted on the mounting table 202b outside of the ID reading position.

When it is determined that the wafer 102b is at the ID reading position even after the wafer 102a is kept waiting for a predetermined time, the controller 210 stops the operation of the alignment device 200 and issues an alarm.

(ID Reading)

When it is determined that the wafer 102b is outside the ID reading position (not at the ID reading position) after such ID reading preparation (Yes in Step S4), the controller 210 moves the wafer 102a to the ID reading position (Step S5).

The moving is performed as follows. That is, the controller 210 controls the X-axis drive motor 218a, the Y-axis drive motor 222a, and the mounting table drive motor 224a via the movement unit 204a based on data related to the circumferential position of the notch portion 112 of the wafer 102a and the center position 102ac of the wafer 102a obtained in the previous notch portion detecting. Then, the controller 210 moves the mounting table 202a horizontally and rotationally, so that a part in which the ID is embedded on a peripheral portion of the wafer 102a comes directly above the ID reading unit 208. Accordingly, the wafer 102a is moved to the ID reading position. According to standards, the ID of the wafer is embedded at a position separated by a predetermined angle from the notch portion in the wafer, so that such control is possible.

In this way, when the wafer 102a comes to the ID reading position, the controller 210 reads the ID of the wafer 102a via the ID reading unit 208 (Step S6).

Next, the controller 210 determines whether the ID reading unit 208 reads the ID of the wafer 102a (Step S7). When the ID of the wafer 102a is not correctly read (No in Step S7), the controller 210 instructs retry of reading the ID. This ensures reading of the ID.

Meanwhile, when the ID of the wafer 102a is correctly read (Yes in Step S7), the controller 210 controls the position of the mounting table 202a in the horizontal plane via the movement unit 204a, so that the wafer 102a is moved to a next position for bringing the wafer. At the same time, the controller 210 controls the position of the mounting table 202b in the horizontal plane via the movement unit 204b, so that the wafer 102b is moved to the ID reading position.

(Interlock Preventing Interference between Wafers—Second Position Control)

Next, method for preventing interference between the wafers 102a and 102b when the wafer 102a is in the ID reading is described.

As described above, in the ID reading preparation (Step S4), the controller 210 controls the position of the mounting table 202b in the horizontal plane via the movement unit 204b while waiting for the wafer 102a to move to the ID reading position, so as to prevent the interference between the wafers 102a and 102b. Accordingly, the controller 210 moves the wafer 102b mounted on the mounting table 202b outside of the ID reading position. Here, the controller 210 has an interlock function of controlling the positions of the mounting tables 202a and 202b in the horizontal plane via the movement units 204a and 204b, so as to prevent the interference between the wafers 102a and 102b.

The alignment method of the present embodiment includes interlock based on this function. Evacuation movement of the wafer 102b from the ID reading position in the ID reading preparation (Step S4) is an example of utilizing this function. In the ID reading, a step particularly prepared for utilizing this function is referred to as a "second position control" in the present specification.

The interlock function not only prevents interference between wafers, but also contributes to preventing IDs of two wafers from being read at the same time since one wafer always comes to the position of the ID reading unit 208 by the above-described sequence.

In the alignment device 200 of the present embodiment, an interlock unit based on the interlock function is also installed to the controller 210.

Here, an example of an interlock method adopted in the "second position control" is described. Examples of the interlock method include following methods (1) to (3).

(1) The controller 210 controls the positions of the mounting tables 202a and 202b in the horizontal plane via the movement units 204a and 204b to prevent interference between the two wafers 102a and 102b.

The controller 210 controls positions the mounting tables 202a and 202b since the controller 210 stores histories of the center positions 202ac and 202bc of the mounting tables 202a and 202b.

(2) This method is adopted in the present embodiment described above, and is a specific example of the method (1). For example, in order to prevent interference between the two wafers 102a and 102b, the controller 210 performs control to read the ID of one wafer 102a, controls the positions of the mounting tables 202a and 202b in the horizontal plane via the movement units 204a and 204b, and performs control to read the ID of another wafer 102b. Accordingly, the controller 210 restricts movement of another wafer 102b to the ID reading unit 208 while the ID of one wafer 102a is being read, and moves another wafer 102b to the ID reading unit 208 after the ID of one wafer 102a is read.

(3) In order to prevent interference between the two wafers 102a and 102b, the controller 210 may control the positions of the mounting tables 202a and 202b in the horizontal plane via the movement units 204a and 204b and perform control to read the IDs of the wafers 102a and 102b alternately with a time difference.

(Alignment and Wafer Unloading—Alignment and Bringing of Wafer 102)

When the ID of the wafer 102a is read in Step S6 and Step S7, the controller 210 moves the wafer 102a to a wafer bringing position, and aligns the notch portion 112 in the wafer 102a (Step S8).

Figure 12C:
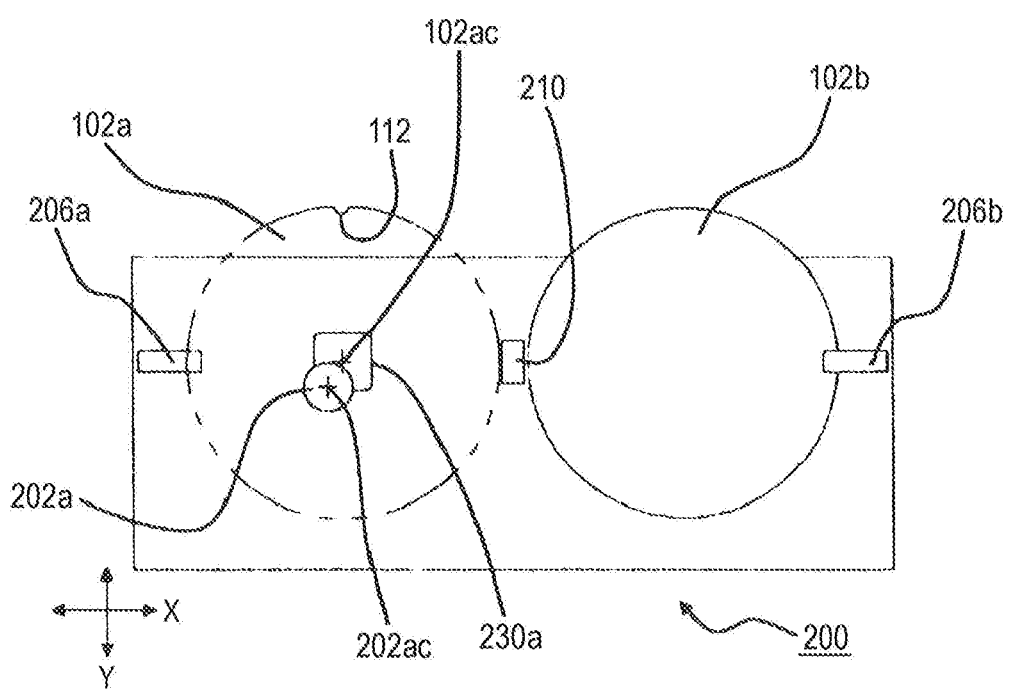
FIG. 12C is a top view of the alignment device when a wafer is at a wafer bringing position.

FIG. 12C illustrates a state immediately after the wafer 102a is moved to the wafer bringing position to align the notch portion 112 of the wafer 102a.

The movement of the wafer 102a to the wafer bringing position and the alignment of the notch portion 112 of the wafer 102a are performed as follows. The controller 210 controls the X-axis drive motor 218a, the Y-axis drive motor 222a, and the mounting table drive motor 224a via the movement unit 204a based on the data related to the circumferential position of the notch portion 112 of the wafer 102a and the center position 102ac of the wafer 102a obtained in the previous notch portion detecting. Accordingly, the wafer 102a is moved to a position for the arm 104 of the robot 103 to bring the wafer 102a, and is rotated at the same time such that the notch portion 112 comes to a predetermined position in the circumferential direction.

Accordingly, the alignment of the wafer 102a is completed, the wafer 102a is brought by the robot 103, and a new wafer is mounted on the mounting table 202a of the alignment device 200.

(Relationships Between Positions)

Next, relationships between the alignment position and the bringing position of the wafer 102a, the initial position of the mounting table 202a, and the "predetermined position in the circumferential direction" are described in detail.

As described above, the notch portion 112 in the wafer 102a is aligned with the bringing position of the wafer 102a. In other words, the notch portion 112 of the wafer 102a at the bringing position is located on a side of the robot 103 in FIG. 5 (the right side in FIG. 5), and a direction thereof is aligned in a predetermined direction (the Y direction in FIG. 12C). Moreover, as illustrated in FIG. 12C, the position of the notch portion 112 in the X direction is set at the same position as the center of the opening 230a (the initial position of the mounting table 202a in FIG. 12A). At this time, the center position 202ac of the mounting table 202a and the center position 102ac of the wafer 102a may not coincide with each other depending on relative positions between them when the wafer 102a is transferred to the mounting table 202a, as illustrated in FIG. 12C.

The bringing position of the wafer 102a refers to the "predetermined position in the circumferential direction" when the wafer 102a is aligned.

In this state (a state in which positions and postures are aligned), the wafer 102a waits for the robot 103 to bring the wafer 102a properly. Therefore, when the wafer 102a is brought by the robot 103, the center position 102ac of the wafer 102a coincides with a center position of a wafer mounting portion of the arm 104 of the robot 103. As a result, the robot 103 does not have to adjust a wafer receiving position finely to align these two center positions, loss of wafer transferring time is eliminated, and throughput of the device is improved.

(Interlock Preventing Interference between Wafers—First Position Control)

Next, method for preventing interference between the wafers 102a and 102b when the wafer 102a is in the alignment is described.

When the wafer 102a is moved to the wafer bringing position, the notch portion 112 in the wafer 102a is aligned. At this time, as described above, the center position 202ac of the mounting table 202 may not coincide with the center position 102ac of the wafer 102a. In this case, the center position 202ac of the mounting table 202a is shifted from the center position 102ac of the wafer 102a, as illustrated in FIG. 12C. Thus, the wafer 102a is rotated in a deviated state when being rotated for alignment of the notch portion 112.

Meanwhile, the wafer 102b is on the mounting table 202b, and is in the wafer transferring, the ID reading preparation, the ID reading, the alignment or the wafer bringing. Operation of the wafer 102b is out of order depending on cases, and may also be in the notch portion detecting. The wafer 102b and the mounting table 202b may be in a deviating state even in any step, which is as in the case of the wafer 102a and the mounting table 202a (see FIGS. 12A to 12C). Therefore, it is essential to provide method for preventing any one or both of the wafer 102a and the wafer 102b from interfering with each other when the wafer 102a or the wafer 102b is rotated for any of the processing steps.

In the wafer alignment of the alignment method according to the present embodiment, the "interlock function" of the controller 210 described above is utilized as such method. In this specification, a particularly prepared step is referred to as a "first position control".

Here, the interlock method employed in the "first position control" is the same as the interlock method (1) employed in a "second position control", and the controller 210 controls the positions of the mounting tables 202a and 202b in the horizontal plane via the movement units 204a and 204b to prevent interference between the two wafers 102a and 102b.

(Performing Patterns in Alignment Method)

Next, various patterns of combinations of steps in the alignment method of the present embodiment are described.

The two mounting tables 202a and 202b arranged side by side in the horizontal plane in the alignment device 200 may be independently controlled by the controller 210. Therefore, in the alignment method according to the present embodiment, steps other than the ID reading may be performed independently for the wafers 102a and 102b mounted on the mounting tables. Further, in the alignment method according to the present embodiment, it may be necessary to independently perform the steps depending on histories of previous steps performed on the wafers 102a and 102b.

In the alignment method according to the present embodiment, steps of transferring the wafer 102a, bringing the wafer 102a, or detecting the notch portion of the wafer 102a in an area of the mounting table 202a, and steps of transferring the wafer 102b, bringing the wafer 102b or detecting the notch portion of the wafer 102b in an area of the mounting table 202b may be performed continuously or partially overlapped. When these steps are performed in combinations, there may be various patterns in combinations of operation of equipment (the robot and the notch portion detection unit) that perform these steps.

Hereinafter, typical examples of such patterns are listed and described.

Additionally, a pattern (3) to be described below is an example in which three mounting tables 202a, 202b, and 202c are provided as a modification of the present embodiment.

In a pattern (1), transferring operation of the wafer 102a or bringing operation of the wafer 102a in the area of the mounting table 202a, and detecting operation of the notch portion 112 in the mounted wafer 102b mounted in the area of the mounting table 202b are performed continuously or partially overlapped.

In a pattern (2), detecting operation of the notch 112 in the wafer 102a mounted in the area of the mounting table 202a and the detecting operation of the notch portion 112 in the mounted wafer 102b in the area of the mounting table 202b are performed continuously or partially overlapped.

In a pattern (3), the transferring operation of the wafer 102a in the area of the mounting table 202a, bringing operation of the wafer 102b in the area of the mounting table 202b, and detecting operation of the notch portion 112 in a wafer 102c mounted in an area of the mounting table 202c are performed continuously or partially overlapped.

As described above, the alignment device 200 according to the present embodiment includes: the mounting tables 202a and 202b arranged side by side in the horizontal plane on which the wafers 102a and 102b are mounted; the movement units 204a and 204b that rotationally move the mounting tables 202a and 202b respectively: two notch portion detection units 206a and 206b that detect respectively the circumferential positions of the notch portions 112 at the edges of the wafers 102a and 102b mounted on the mounting tables 202a and 202b; and the controller 210 that controls, via the movement units 204a and 204b, the positions of the mounting tables 202a and 202b in the horizontal plane to prevent interference between the wafers 102a and 102b when the circumferential positions of the notch portions 112 of the wafers 102a and 102b are aligned in the predetermined position. Each of the mounting tables 202a and 202b includes the mounting table main body portion 301 and at least one pad 1 attached to the opening 302 in the mounting table main body portion 301 to hold the wafers 102a and 102b. The pad 1 includes: the main body portion 2 that is attached to the opening 302 and has the through hole 5 in the center portion thereof; the annular portion 31 at the end portion of the pad 1 to abut against the wafers 102a and 102b; and the collar portion 32 that is integrally provided with the annular portion 31 and the main body portion 2 and extends toward the outside of the main body portion 2. The outer diameter R2 of the annular portion 31 is smaller than the outer diameter R1 of the main body portion 2. According to this configuration, the contact area between the wafers 102a and 102b and the annular portion 31A of the pad 1 is reduced. Therefore, the adhesion of particles to the wafers 102a and 102b caused by contact between the wafers 102a and 102b and the pad 1 is suppressed. According to this configuration, the pad 1 is attached to the alignment device 200 simply by deforming the pad 1 to press the pad 1 and inserting the pad 1 in the opening 302 of the mounting table main body portion 301 that serves as a pad mounting hole. For this reason, special tools or members are not required when attaching the pad 1 to the opening 302 and detaching the pad 1 from the opening 302. Therefore, attachment and detachment work is easy, and member costs associated with attachment and detachment is zero. Further, since the pad 1 is made of a resin composition containing conductive particles, static electricity charged on a wafer is grounded by bringing the pad 1 into contact with the wafer. As a result, no spark is generated between the pad 1 and the wafer. Consequently, the wafer is not damaged, and yields thereof are improved.

In the alignment device 200 of the present embodiment, the annular portion 31 includes the annular portion 31A (an example of the first annular portion) on a front end side of the pad 1, and the annular portion 31B (an example of the second annular portion) on a rear end side of the pad 1 that has the same shape as the annular portion 31A. The collar portion 32 includes the collar portion 32A (an example of the first collar portion) integrally provided with the annular portion 31A and the main body portion 2, and the collar portion 32B (an example of the second collar portion) integrally provided with the annular portion 31B and the main body portion 2. In this way, since the annular portion 31A and the annular portion 31B have symmetric structures, either of the annular portion 31A and the annular portion 31B may be a side to be in contact with a wafer. Further, since the collar portion 32A and the collar portion 32B have symmetrical structures, erroneous installation when the pad 1 is attached to the alignment device 200 is prevented, and attachment of the pad 1 is easy.

In the alignment device 200 of the present embodiment, the mounting table main body portion 301 includes the passage 303 therein. One end portion of the passage 303 is connected to the opening 302, and the other end portion thereof is connected to the intake and exhaust unit. Accordingly, when there is no suction and cycle time of wafer transferring is insufficient, or when a suction force is insufficient, the wafers 102a and 102b can be transferred in a state of being held reliably by providing another intake and exhaust unit separately and performing vacuum-evacuation through the passage 303.

In the alignment device 200 of the present embodiment, the mounting table main body portion 301 is clamped by the collar portion 32A and the collar portion 32B when the pad 1 is attached to the mounting table main body portion 301, so that the pad 1 is held in securely close contact with the mounting table main body portion 301. This prevents the pad 1 from falling off the alignment device 200.

According to the alignment device 200 of the present embodiment, when the pad 1 is worn out by use, only the pad 1 may be detached and replaced without replacing the alignment device 200 itself. The pad 1 is detached and attached manually and easily without special tools, members, or the like during the replacement. Further, the pad 1 is free from front and back during first attachment, and an opposite back side (a side in the passage 303) thereof is reused once the pad 1 is detached after being first attached to use a front side thereof. Therefore, time required for replacement work is greatly reduced, and no member cost is required for replacement. Further, one pad 1 may be used twice.

According to the pad 1 according to the present embodiment, the replacement work of the pad 1 is further easier when the pad 1 is attached to the alignment device 200 since attachment of a seal member such as a vacuum suction pad disclosed in JP-B-4720790 is not necessary.

Since the alignment device 200 of the present embodiment is configured and operates as described above, following effects can be obtained.

(1) In the alignment device 200 of the present embodiment, the plurality of wafers 102a and 102b can be aligned at the same time. While including the ID reading unit 208, the alignment device has a compact size, low costs, and high throughput.

(2) The alignment device 200 of the present embodiment can prevent an accident in which the expensive wafers 102a and 102b are damaged due to collision with each other during the alignment operation (detecting operation and alignment operation of the circumferential positions of the notch portions 112 in the wafers 102a and 102b) and the ID reading operation. Further, the alignment device 200 of the present embodiment can prevent the IDs of the wafers 102a and 102b mounted on the mounting tables 202a and 202b from being read at the same time, and prevent processing histories of the wafers 102a and 102b from being confusing.

Since the semiconductor wafer processing device (including the sorter 101) of the present embodiment is configured and operates as described above, following effects can be obtained.

The semiconductor wafer processing device of the present embodiment further includes the robot 103 in addition to the alignment device 200. The robot 103 can load (transfer) the wafers 102a and 102b respectively to a plurality of mounting tables 202a and 202b arranged side by side in the horizontal plane of the alignment device 200, and bring the wafers 102a and 102b from the mounting tables 202a and 202b. Therefore, a processing speed of alignment and delivery of the wafers 102a and 102b are increased, and the throughput of the semiconductor wafer processing device can be improved. Further, by using the robot 103 of double-arm type, two wafers 102a and 102b can be brought and transferred at once when wafers are transferred between the robot 103 and the alignment device 200, so that the throughput of the semiconductor wafer processing device can be further improved.

Since the alignment method of the present embodiment is configured as described above, following effects can be obtained.

(1) According to the alignment method of the present embodiment, since a plurality of wafers 102a and 102b can be aligned at the same time and the ID reading is included, the semiconductor wafer processing device has a compact size, low costs, and high throughput.

(2) According to the alignment method of the present embodiment, it is possible to prevent an accident in which the expensive wafers 102a and 102b are damaged due to collision with each other during the alignment operation (positioning operation) and the ID reading operation. Further, according to the alignment method of the present embodiment, it is possible to prevent the IDs of the wafers 102a and 102b mounted on the mounting tables 202a and 202b from being read at the same time, and the processing histories of the wafers 102a and 102b can be prevented from being confusing.

(3) According to the alignment method of the present embodiment, the plurality of mounting tables 202a and 202b can perform steps, except the ID reading, independently of steps of other mounting tables 202b and 202a. Therefore, the degree of freedom of transferring wafers to the alignment device 200 and bringing wafers from the alignment device 200 can be increased, and the throughput of the device can be further improved.

(4) According to the alignment method of the present embodiment, even when the wafers 102a and 102b are at abnormal positions due to a certain trouble in the wafer transferring, it is possible to prevent an accident, such as damage due to collision between the wafers 102a and 102b, in later steps.

(5) According to the alignment method of the present embodiment, the center positions 102ac and 102bc of the wafers 102a and 102b and the center position of the wafer mounting portion (hand) of the arm of the robot 103 are aligned. Therefore, the robot 103 does not have to adjust the wafer receiving position finely, loss of wafer transferring time between the alignment device 200 and the robot 103 is eliminated, and the throughput of the device can be further improved.

Modifications of Embodiment

Figure 14:
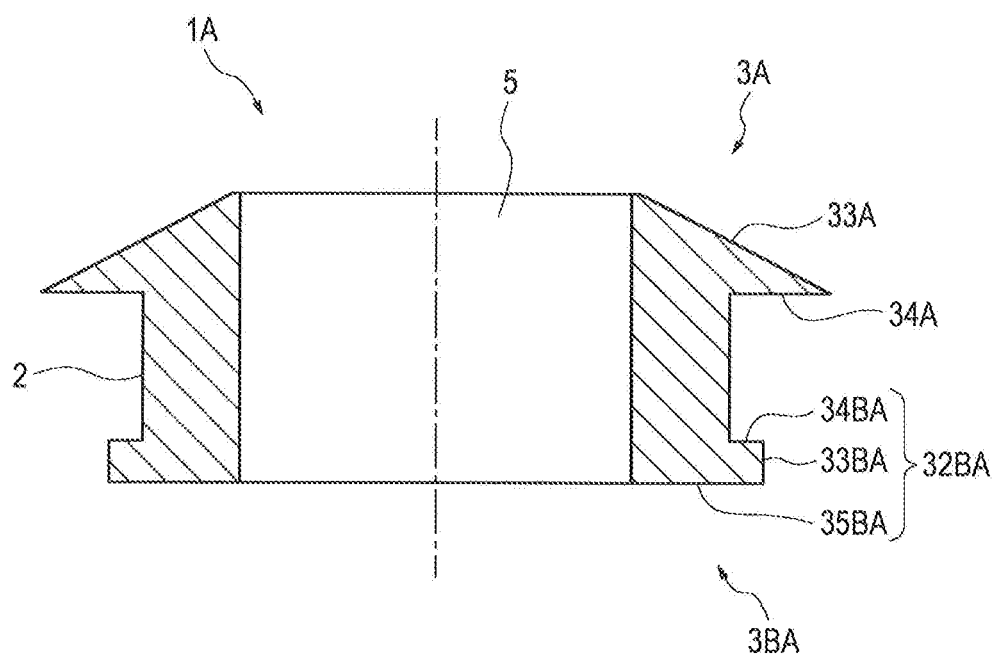
FIG. 14 is a cross sectional view illustrating a modification of the pad according to the present invention.

In the above embodiment, the holding portion 3 including the annular portion 31 and the collar portion 32 is at both end portions of the main body portion 2, but the present invention is not limited thereto. The holding portion 3 may be provided on at least one end portion of the main body portion 2. For example, as in a pad 1A illustrated in FIG. 14, a holding portion having a shape different from a shape of the holding portion 3 of the above embodiment may be provided at an end portion of the main body portion 2 (a lower end portion in FIG. 14) that is inserted into the mounting table main body portion 301. Specifically, in the pad 1A, a holding portion 3BA that is inserted into the mounting table main body portion 301 includes a collar portion 32BA (an example of a third collar portion) extending toward outside of the main body portion 2. The collar portion 32BA includes, a surface 35BA at an edge of the through hole 5 that is parallel to a surface orthogonal to a height direction of the main body 2, a surface 33BA from an outer end portion of the surface 35BA that is perpendicular to the main body portion 2, and a surface (seating surface) 34BA at a part of the collar portion 32BA which is in contact with the main body portion 2 that is parallel to a surface orthogonal to the height direction of the main body portion 2. With this configuration, the pad 1A can also be attached to the alignment device 200 to be in securely close contact therewith by clamping the mounting table main body portion 301 with the collar portions 32A and 32BA on the both ends of the main body portion 2. Therefore, it is possible to prevent the pad 1A from falling off the alignment device 200.

In the above embodiment, the main body portion 2 has a cylindrical shape, but the present invention is not limited thereto. The main body 2 is appropriately selected according to a shape of the opening 302, and may be a prismatic shape such as a quadrangular prism or a polygonal column.

In the above embodiment, the holding portion 3 (3A, 3B) has a truncated cone shape, but the present invention is not limited thereto. The holding portion 3 is also appropriately selected according to the shape of the opening 302, and may be, for example, a truncated pyramid shape.

In the above embodiment, the annular portion 31 (31A, 31B) has a substantially flat shape orthogonal to an axial direction of the main body portion 2, but the present invention is not limited thereto. For example, the annular portion 31 (31A, 31B) may be an inclined surface gradually inclined to the collar portion 32 (32A, 32B) toward inside (toward the through hole 5) thereof, or an inclined surface gradually inclined to the collar portion 32 (32A. 32B) toward outside (separating from the through hole 5) thereof. In the former case, an outer peripheral side edge portion of the annular portion 31 (31A, 31B) is in contact with a wafer, and in the latter case, an inner peripheral side edge of the annular portion 31 (31A, 31B) is in contact with the wafer.

Figure 15:
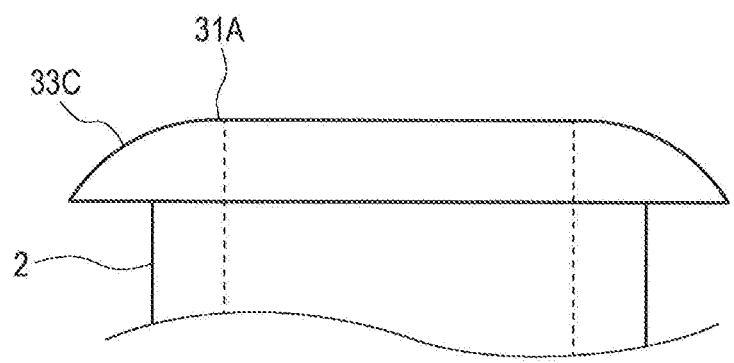
FIG. 15 is a partially enlarged front view illustrating a modification of the pad according to the present invention.
Figure 16:
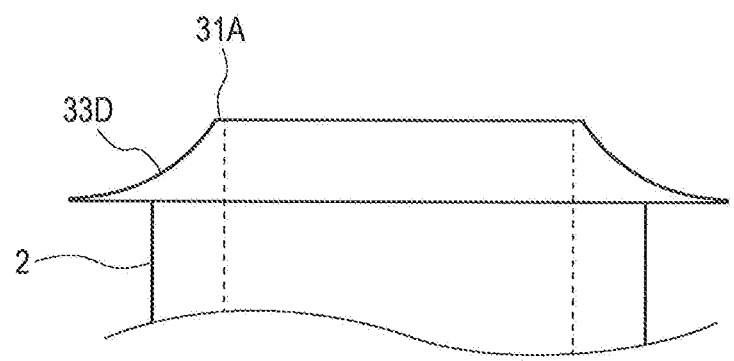
FIG. 16 is a partially enlarged front view illustrating a modification of the pad according to the present invention.
Figure 17:
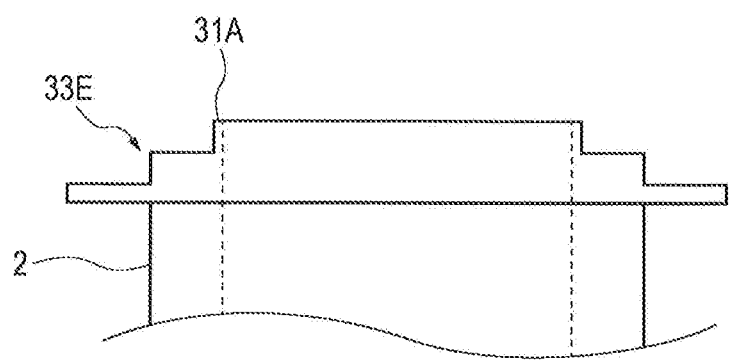
FIG. 17 is a partially enlarged front view illustrating a modification of the pad according to the present invention.

In the above embodiment, the tapered portion 33 (33A, 33B) has a straight-line shaped ridge line in a front view, but the present invention is not limited thereto. For example, the ridge line in the front view may be an upwardly convex arc tapered portion 33C (see FIG. 15) or a downwardly concave arc tapered portion 33D (see FIG. 16). The tapered portion may not be continuous, and may be a tapered portion 33E (see FIG. 17) having a stepped shape in a front view.

The alignment may be performed without the ID reading unit 208 and the ID reading. However, in this case, the ID reading unit 208 is installed in another place.

In the above embodiment, a case where two mounting tables (the mounting tables 202a and 202b) are provided in the alignment device 200 has been described as an example, but the present invention is not limited thereto. For example, three or more mounting tables may be provided in the alignment device. In this case, the number of ID reading units 208 is increased according to the number of mounting tables to be increased.

Even in an alignment device including only one mounting table, the pad 1 of the above embodiment can be attached to the mounting table. In this configuration, it is possible to suppress the adhesion of particles to a wafer since a contact area between a wafer and the annular portion 31A of the pad 1 can be reduced. It is also possible to achieve easy attachment work of the pad 1 to a mounting table main body portion and detachment work thereof from a mounting table main body portion as in the above embodiment.

A case in which a laser sensor is used as the notch portion detection units 206a and 206b has been described as an example, but the present invention is not limited thereto, and sensors such as a reflective sensor may be used.

The present invention is not limited to the above embodiment, and may be modified or improved as appropriate. Materials, shapes, sizes, numerical values, forms, numbers, arrangement places, and the like of components in the above embodiment are arbitrary and not limited as long as the present invention can be achieved.

DESCRIPTION OF REFERENCE NUMERALS

1 pad
2 main body portion
3 holding portion
3A first holding portion
3B second holding portion
5 through hole
31 (31A, 31B) annular portion (an example of a first annular portion and a second annular portion)
32 (32A, 32B) collar portion (an example of a first collar portion and a second collar portion)
33 (33A, 33B) tapered portion
34 (34A, 34B) seating surface
101 sorter
102 (102a, 102b) wafer
103 transferring device (robot)
104 arm
105a, 105b load port
112 notch portion
200 alignment device
202a, 202b mounting table
204a, 204b movement unit
206a, 206b notch portion detection unit
208 ID reading unit
210 controller
291 notch
301 mounting table main body portion
302 opening
303 passage
304 mounting surface

What is claimed is:

1. An alignment device which aligns notch portions at edges of wafers to a predetermined position in a circumferential direction, the alignment device comprising:
    a plurality of mounting tables on which the wafers are mounted and that are arranged side by side in a horizontal plane;
    a plurality of movement units that are configured to rotate the mounting tables respectively, and that are configured to move the mounting tables in a predetermined direction in the horizontal plane;
    a plurality of notch portion detection units that corresponds to the mounting tables, that are configured to respectively detect circumferential positions of the notch portions at the edges of the wafers mounted on the mounting tables; and a controller that is configured to respectively detect the circumferential positions of the wafers by the notch portion detection units, and that is configured to control positions of the mounting tables in the horizontal plane by the movement units based on information on the detected circumferential positions to prevent interference between the wafers when respectively rotating the wafers mounted on the mounting tables by the movement units, so that the circumferential positions are respectively aligned at positions in predetermined circumferential directions, wherein each of the plurality of mounting tables includes a mounting table main body portion, and a pad member that is attached to an opening in the mounting table main body portion and that is configured to hold the wafers, wherein the pad member includes:

a main body portion that is attached to the opening and that includes a through hole in a central portion thereof;

a first annular portion that is on an end side of the pad member and that is configured to abut against a wafer; and a first collar portion that is integrally provided with the first annular portion and the main body portion and that is extended toward outside of the main body portion.

2. The alignment device according to claim 1, wherein the pad member further includes:

a second annular portion that is on a rear end side of the pad member and that has the same shape as the first annular portion; and a second collar portion that is integrally provided with the second annular portion and the main body portion and that is seated in the mounting table main body portion.

3. The alignment device according to claim 2, wherein the main body portion is a cylindrical member, and wherein the second collar portion includes a tapered portion configured to expand in diameter from the second annular portion side toward the main body portion side.

4. The alignment device according to claim 2, wherein the pad member is attached to the mounting table main body portion by clamping the mounting table main body portion with the first collar portion and the second collar portion.

5. The alignment device according to claim 1, wherein the pad member further includes:

a third collar portion that is integrally provided with the main body portion on a rear end side of the pad member and that is extended toward outside of the main body portion.

6. The alignment device according to claim 5, wherein the pad member is attached to the mounting table main body portion by clamping the mounting table main body portion with the first collar portion and the third collar portion.

7. The alignment device according to claim 1, wherein the mounting table main body portion includes a passage therein, one end portion of the passage is connected to the opening.

8. The alignment device according to claim 1, wherein the main body portion is a cylindrical member, and wherein the first collar portion includes a tapered portion configured to expand in diameter from the first annular portion side toward the main body portion side.

9. The alignment device according to claim 1, wherein the pad member is made of a conductive resin obtained by dispersing conductive particles in a resin composition.

10. The alignment device according to claim 1, wherein an outer diameter of the first annular portion is smaller than an outer diameter of the main body portion.

11. A semiconductor wafer processing device comprising the alignment device according to claim 1, the semiconductor wafer processing device further comprising:

a transferring device, wherein the transferring device is configured to respectively load the wafers to the plurality of mounting tables of the alignment device which are arranged side by side in the horizontal plane and configured to respectively bring the wafers from the mounting tables.

12. The semiconductor wafer processing device according to claim 11, wherein the transferring device is a double arm robot.

* * * * *